United States Patent
Kawanami et al.

(10) Patent No.: US 9,224,956 B2
(45) Date of Patent: Dec. 29, 2015

(54) METHOD FOR MANUFACTURING ORGANIC THIN-FILM ELEMENT, APPARATUS FOR MANUFACTURING ORGANIC THIN-FILM ELEMENT, METHOD FOR FORMING ORGANIC FILM, AND METHOD FOR MANUFACTURING ORGANIC EL ELEMENT

(71) Applicant: JOLED INC., Tokyo (JP)

(72) Inventors: Yuko Kawanami, Osaka (JP); Ryuuta Yamada, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/386,543

(22) PCT Filed: Mar. 19, 2013

(86) PCT No.: PCT/JP2013/001873
§ 371 (c)(1),
(2) Date: Sep. 19, 2014

(87) PCT Pub. No.: WO2013/145640
PCT Pub. Date: Oct. 3, 2013

(65) Prior Publication Data
US 2015/0087098 A1    Mar. 26, 2015

(30) Foreign Application Priority Data
Mar. 27, 2012 (JP) ................. 2012-071726

(51) Int. Cl.
*H01L 21/00* (2006.01)
*H01L 51/00* (2006.01)
(Continued)

(52) U.S. Cl.
CPC ............ *H01L 51/0029* (2013.01); *B01J 3/006* (2013.01); *C23C 14/564* (2013.01); *F04B 37/14* (2013.01);
(Continued)

(58) Field of Classification Search
CPC . H01L 51/56; H01L 51/0029; H01L 51/0025; H01L 51/50; H01L 51/5056; C23C 14/564
USPC ........................................ 438/46; 134/21, 37
See application file for complete search history.

(56) References Cited

U.S. PATENT DOCUMENTS

| 5,443,922 A | 8/1995 | Nishizaki et al. |
| 6,361,618 B1 * | 3/2002 | Nulman ................. F04B 37/08 134/19 |

(Continued)

FOREIGN PATENT DOCUMENTS

| JP | 01-219367 | 9/1989 |
| JP | 03-157585 | 7/1991 |

(Continued)

OTHER PUBLICATIONS

Razzouk et al., "Vapor and Sublimination Pressures of Three Normal Alkanes: $C_{20}$, $C_{24}$ & $C_{28}$", J. Chem. Eng. Data, 54, 2009, pp. 1214-1219.

(Continued)

*Primary Examiner* — Michael Trinh
(74) *Attorney, Agent, or Firm* — Greenblum & Bernstein, P.L.C.

(57) ABSTRACT

A method for reducing an internal pressure of a vacuum chamber while preventing impurity contamination within the vacuum chamber as much as possible is provided. The method includes: rough pumping reducing an internal pressure of a vacuum chamber by using a roughing pump, the roughing pump being a mechanical pump that is capable of reducing the internal pressure of the vacuum chamber to be less than 15 Pa; main pumping reducing the internal pressure of the vacuum chamber by using a main pump after the rough pumping, the main pump being a non-mechanical pump. Transition from the rough pumping to the main pumping is performed when the internal pressure of the vacuum chamber is no less than 15 Pa.

12 Claims, 23 Drawing Sheets

(51) Int. Cl.
   *H01L 51/50*   (2006.01)
   *F04B 37/14*   (2006.01)
   *C23C 14/56*   (2006.01)
   *B01J 3/00*    (2006.01)
   *F17D 3/00*    (2006.01)
   *H01L 51/56*   (2006.01)
   *H01L 27/32*   (2006.01)

(52) U.S. Cl.
   CPC .............. *F17D 3/00* (2013.01); *H01L 51/0021* (2013.01); *H01L 51/5056* (2013.01); *H01L 51/56* (2013.01); *H01L 27/3211* (2013.01); *H01L 51/001* (2013.01); *Y10T 137/0379* (2015.04)

(56) References Cited

U.S. PATENT DOCUMENTS

| | | | |
|---|---|---|---|
| 6,537,707 B1 * | 3/2003 | Lee | C23C 14/54 216/27 |
| 8,137,473 B2 * | 3/2012 | Moriya | B08B 3/12 134/1 |
| 8,475,623 B2 * | 7/2013 | Kaise | H01J 37/32743 156/345.24 |
| 2014/0202848 A1 | 7/2014 | Kawanami | |

FOREIGN PATENT DOCUMENTS

| | | |
|---|---|---|
| JP | 05-004034 | 1/1993 |
| JP | 05-163488 | 6/1993 |
| JP | 06-093427 | 4/1994 |
| JP | 08-138615 | 5/1996 |
| JP | 09-250454 | 9/1997 |
| JP | 2000-192883 | 7/2000 |
| JP | 2009-008474 | 1/2009 |
| JP | 2009-267299 | 11/2009 |
| JP | 2011-044299 | 3/2011 |
| JP | 2011-256129 | 12/2011 |

OTHER PUBLICATIONS

U.S. Appl. No. 14/348,103 to Yuko Kawanami et al., which was filed on Mar. 28, 2014.

Search report from PCT/JP2013/001873, mail date is Jun. 18, 2013.

* cited by examiner

Time A

Time B

Time C

Stored in cryogenic pump environment <12hr>

Stored in glovebox environment <12hr>

Stored in mechanical booster pump environment <20min>

| Temperature [K] | Temperature [°C] | Vapor pressure [Pa] |
|---|---|---|
| 333.09 | 59.94 | 0.00458 |
| 353.20 | 80.05 | 0.0407 |
| 373.13 | 99.98 | 0.268 |

METHOD FOR MANUFACTURING ORGANIC THIN-FILM ELEMENT, APPARATUS FOR MANUFACTURING ORGANIC THIN-FILM ELEMENT, METHOD FOR FORMING ORGANIC FILM, AND METHOD FOR MANUFACTURING ORGANIC EL ELEMENT

TECHNICAL FIELD

The present invention relates to, for example, a method for reducing the internal pressure of a vacuum chamber, and in particular to, for example, a method for reducing the internal pressure of a vacuum chamber by using a roughing pump and a main pump.

BACKGROUND ART

There have been known vacuum apparatuses for reducing the internal pressure of a vacuum chamber by using a roughing pump and a main pump (e.g. Patent Literature 1).

FIG. 23 shows the configuration of a vacuum apparatus pertaining to Patent Literature 1. The vacuum apparatus includes mainly a vacuum chamber 91, a roughing pump 92 and a main pump 93.

The vacuum chamber 91 is a container within which processes of thin film formation, etching, drying of a coating film according to a coating film formation method (e.g. Patent Literature 2), and so on are performed.

The roughing pump 92 is used for rough pumping, or evacuation as the next stage to evacuation by the main pump 93. Rough pumping is pumping for reducing the internal pressure of the vacuum chamber 91 to the vacuum range in which the main pump 93 can operate. As the roughing pump 92, a mechanical vacuum pump such as a mechanical booster pump can be used, for example. In rough pumping, the air within the vacuum chamber 91 is exhausted by operating the roughing pump 92 with a roughing valve 94 open.

The main pump 93 is used for main pumping after the internal pressure of the vacuum chamber 91 has been reduced by the roughing pump 92. The main pump 93 is interposed between the vacuum chamber 91 and the roughing pump 92. As the main pump 93, a non-mechanical vacuum pump such as a cryogenic pump is used, for example. During the main pumping after the rough pumping, the air within the vacuum chamber 91 is evacuated by operating the main pump 93 and the roughing pump 92 with the roughing valve 94 closed and main valves 95 and 96 open.

Such a vacuum apparatus allows for reduction of the internal pressure of the vacuum chamber 91 to high vacuum or ultra-high vacuum.

CITATION LIST

Patent Literature

[Patent Literature 1] Japanese Patent Application Publication No. 01-219367
[Patent Literature 2] Japanese Patent Application Publication No. 2009-267299

Non-Patent Literature

[Non-Patent Literature 1] Antonio Razzouk et al., Journal of Chemical & Engineering Data 54, 1214-1219 (2009)

SUMMARY OF INVENTION

Technical Problem

It is desirable that the inside of the vacuum chamber be almost not contaminated with impurities at all.

The present invention aims to prevent impurity contamination within a vacuum chamber as much as possible when, for example, a method using a roughing pump and a main pump is adopted to reduce the internal pressure of the vacuum chamber.

Solution to Problem

A method pertaining to one aspect of the present invention for reducing an internal pressure of a vacuum chamber includes: rough pumping reducing the internal pressure of the vacuum chamber by using a roughing pump, the roughing pump being a mechanical pump that is capable of reducing the internal pressure of the vacuum chamber to be less than 15 Pa; and main pumping reducing the internal pressure of the vacuum chamber by using a main pump after the rough pumping, the main pump being a non-mechanical pump. Transition from the rough pumping to the main pumping is performed when the internal pressure of the vacuum chamber is no less than 15 Pa.

Advantageous Effects of Invention

The method pertaining to one aspect of the present invention for reducing the internal pressure of a vacuum chamber can prevent impurity contamination within the vacuum chamber as much as possible.

DESCRIPTION OF EMBODIMENTS

Figure 1:
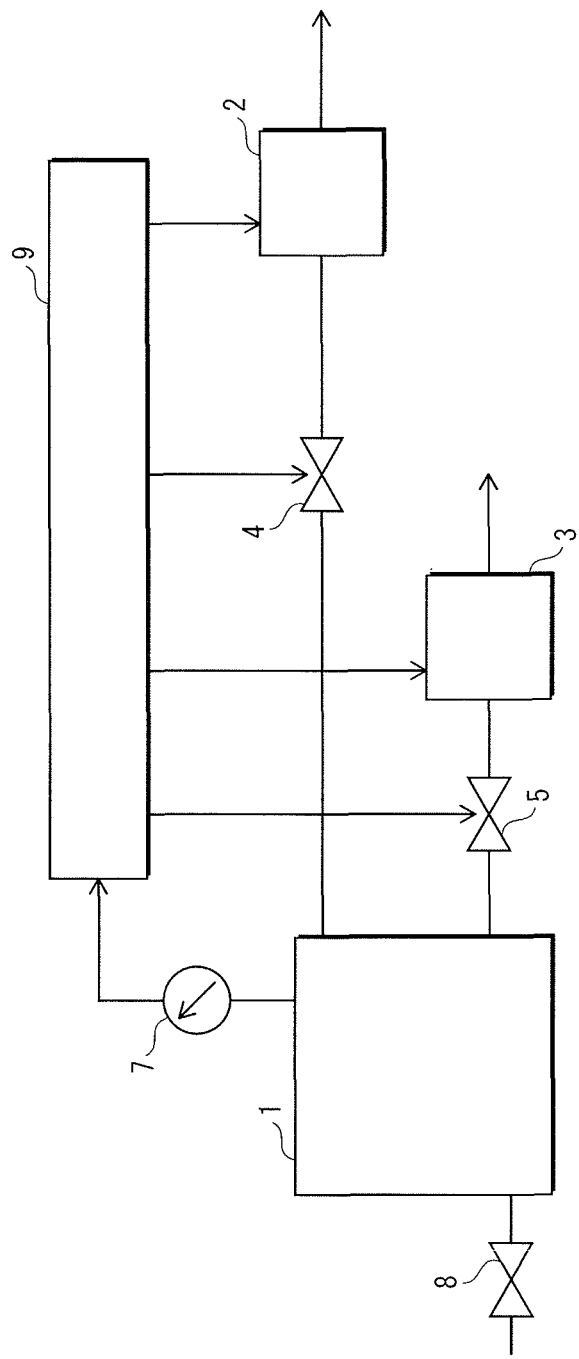
FIG. 1 illustrates the configuration of a vacuum apparatus pertaining to Embodiment 1.

Outline of an Aspect of the Present Invention

A method pertaining to one aspect of the present invention for reducing an internal pressure of a vacuum chamber includes: rough pumping reducing the internal pressure of the vacuum chamber by using a roughing pump, the roughing pump being a mechanical pump that is capable of reducing the internal pressure of the vacuum chamber to be less than 15 Pa; and main pumping reducing the internal pressure of the vacuum chamber by using a main pump after the rough pumping, the main pump being a non-mechanical pump. Transition from the rough pumping to the main pumping is performed when the internal pressure of the vacuum chamber is no less than 15 Pa.

In the rough pumping, a rate of reduction of the internal pressure of the vacuum chamber may be controlled by introducing an inert gas into the vacuum chamber.

The roughing pump may be a mechanical booster pump.

The main pump may perform evacuation by vapor condensation using a cooler.

The main pump may be a cryogenic pump.

A method pertaining to one aspect of the present invention for reducing an internal pressure of a vacuum chamber includes: rough pumping reducing the internal pressure of the vacuum chamber by using a roughing pump, the roughing pump being a mechanical pump that is capable of reducing the internal pressure of the vacuum chamber to be less than 15 Pa and uses a lubricant containing an alkane; and main pumping reducing the internal pressure of the vacuum chamber by using a main pump after the rough pumping, the main pump being a non-mechanical pump. Transition from the rough pumping to the main pumping is performed when a ratio of a vapor pressure of an alkane to the internal pressure of the vacuum chamber is no greater than $7.3 \times 10^{-3}$, the alkane having flown to the vacuum chamber from the roughing pump.

The alkane may be tetracosane.

A method pertaining to one aspect of the present invention for reducing an internal pressure of a vacuum chamber includes: rough pumping reducing the internal pressure of the vacuum chamber by using a roughing pump, the roughing pump being a mechanical pump that is capable of reducing the internal pressure of the vacuum chamber to be less than 15 Pa; and main pumping reducing the internal pressure of the vacuum chamber by using a main pump after the rough pumping, the main pump being a non-mechanical pump. Transition from the rough pumping to the main pumping is performed when a rate of reduction of the internal pressure of the vacuum chamber by the roughing pump is no less than 10 Pa/s.

A vacuum apparatus pertaining to one aspect of the present invention includes: roughing pump connected to a vacuum chamber, the roughing pump being a mechanical pump that is capable of reducing an internal pressure of the vacuum chamber to be less than 15 Pa; main pump connected to the vacuum chamber, the main pump being a non-mechanical pump; a roughing valve opening or closing a roughing exhaust pipe extending from the vacuum chamber to the roughing pump; a main valve provided independently of the roughing valve and opening or closing a main exhaust pipe extending from the vacuum chamber to the main pump; and a controller controlling respective operations of the roughing pump, the main pump, the roughing valve and the main valve. The controller performs a rough pumping operation to open the roughing valve, close the main valve, start operating the roughing pump, and stop operating the main pump, and a main pumping operation to close the roughing valve, open the main valve and start operating at least the main pump, and performs transition from the rough pumping operation to the main pumping operation when the internal pressure of the vacuum chamber is no less than 15 Pa.

A method pertaining to one aspect of the present invention for forming an organic film includes: preparing a substrate coated with an organic film material containing a material of an organic film and a solvent; and placing the substrate coated with the organic film material within a vacuum chamber, and evacuating the vacuum chamber by using a roughing pump and a main pump both connected to the vacuum chamber. The evacuating includes: rough pumping reducing an internal pressure of the vacuum chamber by using a roughing pump, the roughing pump being a mechanical pump that is capable of reducing the internal pressure of the vacuum chamber to be less than 15 Pa; and main pumping reducing the internal pressure of the vacuum chamber by using a main pump after the rough pumping, the main pump being a non-mechanical pump. Transition from the rough pumping to the main pumping is performed when the internal pressure of the vacuum chamber is no less than 15 Pa A method pertaining to one aspect of the present invention for manufacturing an organic EL element includes: preparing a substrate having: a first electrode formed on an upper surface thereof; and a region located above the first electrode and coated with an organic light-emitting layer material containing a material of an organic light-emitting layer and a solvent;

placing the substrate with the region coated with the organic light-emitting layer material into a vacuum chamber, and evacuating the vacuum chamber by using a roughing pump and a main pump both connected to the vacuum chamber; and forming a second electrode above a coating film of the organic light-emitting layer material. The evacuating includes: rough pumping reducing an internal pressure of the vacuum chamber by using a roughing pump, the roughing pump being a mechanical pump that is capable of reducing the internal pressure of the vacuum chamber to be less than 15 Pa; and main pumping reducing the internal pressure of the vacuum chamber by using a main pump after the rough pumping, the main pump being a non-mechanical pump. Transition from the rough pumping to the main pumping is performed when the internal pressure of the vacuum chamber is no less than 15 Pa.

An organic EL display panel pertaining to one aspect of the present invention has an organic EL element manufactured by a method pertaining to one aspect of the present invention for manufacturing an organic EL element.

An organic EL display apparatus pertaining to one aspect of the present invention has an organic EL element manufactured by a method pertaining to one aspect of the present invention for manufacturing an organic EL element.

An organic EL light-emitting apparatus pertaining to one aspect of the present invention has an organic EL element manufactured by a method pertaining to one aspect of the present invention for manufacturing an organic EL element.

A method pertaining to one aspect of the present invention for detecting impurities derived from a vacuum pump connected to a vacuum chamber includes using an organic film as a detector detecting the impurities.

The method may further include: placing the organic film within the vacuum chamber, and evacuating the vacuum chamber; attaching impurities to the organic film, the impurities having flown to the vacuum chamber from the vacuum pump; and analyzing the impurities on a surface and a proximity thereof of the organic film.

Embodiment 1

Configuration of Vacuum Apparatus

FIG. 1 illustrates the configuration of a vacuum apparatus pertaining to Embodiment 1.

The vacuum apparatus pertaining to Embodiment 1 includes a vacuum chamber 1, a roughing pump 2, a main pump 3, a roughing valve 4, a main valve 5, a pressure gage 7 and a controller 9. As with the vacuum apparatus pertaining to Patent Literature 1, the vacuum apparatus performs rough pumping by using the roughing pump 2 to reduce the internal pressure of the vacuum chamber 1 to the vacuum range in which the main pump 3 can operate, and after the rough pumping, performs main pumping by using the main pump 3 to further reduce the internal pressure. Compared to the vacuum apparatus pertaining to Patent Literature 1, however, exhaust pipes and the likes are connected differently.

Figure 23:
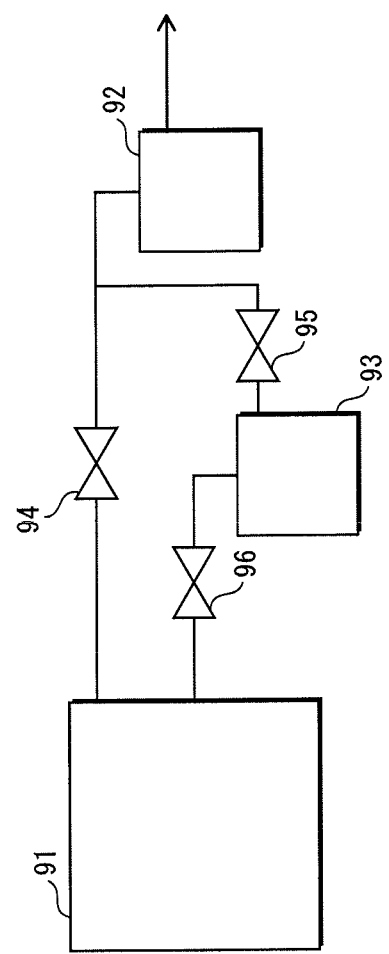
FIG. 23 illustrates the configuration of a vacuum apparatus pertaining to Patent Literature 1.

As with the vacuum chamber 91 shown in FIG. 23, the vacuum chamber 1 is a container in which various processes are performed.

The roughing pump 2 is connected with the vacuum chamber 1. According to the present embodiment, the roughing pump 2 is capable of reducing the internal pressure of the vacuum chamber 1 to be less than 15 Pa. The roughing pump 2 is, for example, a mechanical vacuum pump such as a mechanical booster pump, a rotary pump or a diaphragm pump. Among these, particularly a dry pump which does not use pump oil is preferable for use. A dry pump is used when the inside of the vacuum chamber needs to be kept clean, which is for example when manufacturing a semiconductor thin film.

The main pump 3 is inserted into the vacuum chamber 1. The main pump 3 is, for example, a non-mechanical pump that performs evacuation by vapor condensation using a cooler, such as a cryogenic pump or a sorption pump.

The roughing valve 4 opens or closes a roughing exhaust pipe which extends from the vacuum chamber 1 to the roughing pump 2. The main valve 5 opens or closes a main exhaust pipe which extends from the vacuum chamber 1 to the main pump 3. As shown in FIG. 1, the main exhaust pipe is provided independently of the roughing exhaust pipe.

The pressure gage 7 is for measuring the internal pressure of the vacuum chamber 1, that is, the degree of vacuum within the vacuum chamber 1. As the pressure gauge 7, a Pirani vacuum gauge, a diaphragm vacuum gauge, a spinning-rotor vacuum gauge or the like may be used.

A gas inflow valve 8 is for opening or closing an inflow path of an evacuation rate control gas to be introduced into the vacuum chamber 1. The evacuation rate control gas is used for finely adjusting the rate of the evacuation of the vacuum chamber 1. That is, it is possible to lower the rate of evacuation of the vacuum chamber 1 by introducing the gas into the vacuum chamber 1. Examples of the evacuation rate control gas include, an inert gas such as a nitrogen gas and argon gas, and dry air. The evacuation rate control gas is introduced as necessary, for example when it is difficult to finely adjust the rate of the evacuation of the vacuum chamber 1 with the roughing pump 2 only.

The controller 9 controls the operations of the roughing pump 2, the main pump 3, the roughing valve 4, the main valve 5 and the gas inflow valve 8 according to the degree of vacuum within the vacuum chamber 1 measured by the pressure gage 7. As a consequence, the controller 9 controls, for example, the transition from the rough pumping to the main pumping performed by the vacuum apparatus. Specifically, the controller 9 outputs a control signal to each of the components such as the roughing pump 2 and the main pump 3, and the component receiving the control signal perform the operation corresponding to the received control signal.

[Operations of Controller]

Figure 2:
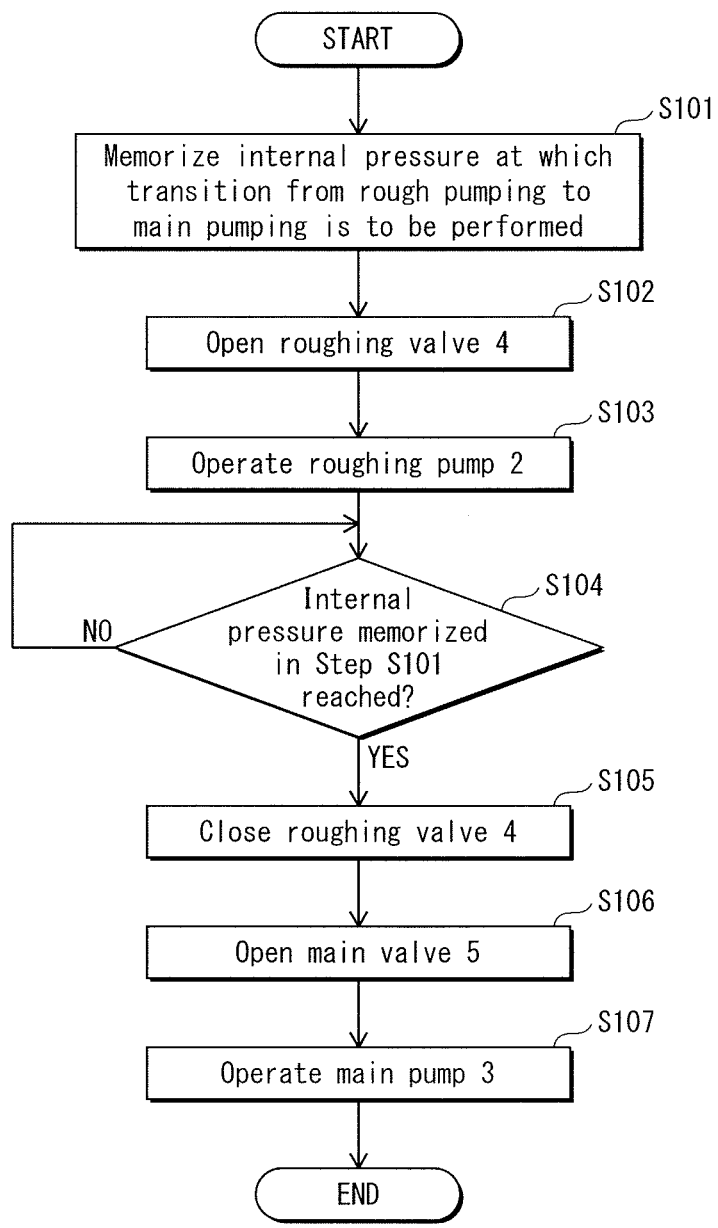
FIG. 2 is a flowchart illustrating operations of a controller 9 included in the vacuum apparatus pertaining to Embodiment 1.

FIG. 2 is a flowchart illustrating operations of the controller 9 included in the vacuum apparatus pertaining to Embodiment 1

First, the controller 9 memorizes the timing at which the transition from the rough pumping to the main pumping is to be performed (Step S101). Specifically, the transition is performed with reference to the internal pressure of the vacuum chamber 1 indicated by the pressure gage 7. According to the present embodiment, the transition is performed when the internal pressure of the vacuum chamber 1 is no less than 15 Pa. The value, namely 15 Pa, is determined according to findings as a consequence of intensive studies by the inventors of the present invention. Such determination is based on the premise that the roughing pump 2 is capable of reducing the internal pressure of the vacuum chamber 1 to be less than 15 Pa. The details of the findings will be described in "Experiments and Analysis" below.

The internal pressure at which the transition is performed is determined before an evacuation process by the vacuum apparatus, and the value of the internal pressure is input to the controller 9 via, for example, a personal computer (PC). Needless to say, the internal pressure of the vacuum chamber 1 at which the transition is performed needs to be included within the range in which the main pump 3 can operate. Also, when an object is be enclosed within the vacuum chamber 1, the object needs to be placed before the subsequent Step S102.

Steps S102 through S104 correspond to the rough pumping. First, the controller 9 opens the roughing valve 4 (Step S102), and then starts operating the roughing pump 2 (Step S103). At this moment, the main valve 5 is in the closed state, and the main pump is in the stopped state. By these rough pumping operations, the internal pressure of the vacuum chamber 1 is reduced from the atmospheric pressure.

Subsequently, the controller 9 determines whether the internal pressure of the vacuum chamber 1 has reached the internal pressure memorized in Step S101 based on the pressure gage 7 (Step S104). If determining that the internal pressure has not reached the value memorized in Step S101 (NO in Step S104), the controller 9 continues the depressurization by the roughing pump 2. When determining that the internal pressure has reached the value memorized in Step S101 (Yes in Step S104), the controller 9 closes the roughing valve 4 and stops the roughing pump 2, and terminates the rough pumping (Step S105).

Note that the evacuation rate control gas is introduced at a time point between Step S103 and Step S105, which is, for example, when the internal pressure of the vacuum chamber 1 approaches the value memorized in Step S101. As the controller 9 opens the gas inflow valve 8, the evacuation rate control gas is introduced into the vacuum chamber 1, and thus the rate of the evacuation of the vacuum chamber 1 is finely adjusted. Note that the introduction of the evacuation rate control gas may be performed at the initial stage of the rough pumping operation in Step S103.

Steps S106 and S107 correspond to the main pumping. The controller 9 opens the main valve 5 (Step S106), and simultaneously starts operating at least the main pump 3 (Step S107). According to the present embodiment, only the main pump 3 is operated, and the roughing pump 2 is in the stopped state. By these main pumping operations, the internal pressure of the vacuum chamber 1 is reduced to the range of medium vacuum to high vacuum, and in some cases to ultra-high vacuum.

As described above, the internal pressure of the vacuum chamber 1 when the roughing pump 2 is at its performance limit is less than 15 Pa. According to the present embodiment, the transition from the rough pumping to the main pumping is performed when the internal pressure of the vacuum chamber 1 is no less than 15 Pa. That is, the transition is performed when the internal pressure of the vacuum chamber 1 is greater than the performance limit of the roughing pump 2. By performing the transition before the internal pressure reaches the performance limit of the roughing pump 2, it is possible to reduce the amount of at least the impurities caused by the use of the roughing pump 2 from among the impurities flying back from the roughing pump 2 to the vacuum chamber 1 to the extent that the impurities have no influence on the object enclosed within the vacuum chamber 1.

[Experiments and Analysis]

<Selection of Experimental Elements>

The inventors of the present invention conducted various experiments on the influence of the occurrence of impurities derived from a vacuum pump, upon an object enclosed within a vacuum chamber. The inventors presumed that the object should preferably contain a component to which impurities are likely to adhere. For this reason, the inventors selected an organic EL element having an organic film to which impurities are likely to adhere. An organic EL element includes an organic light-emitting layer interposed between an anode serving as a first electrode and a cathode serving as a second electrode. The organic light-emitting layer causes an electric-field light-emitting phenomenon as a result of the recombination of carriers (i.e., holes and electrons).

One example of organic light-emitting layer formation methods is a coating film formation method (e.g. Patent Literature 2). According to the coating film formation method, an organic light-emitting layer is formed by applying an organic light-emitting layer material containing an organic material of the organic light-emitting layer and a solvent onto a substrate by an inkjet method (a droplet ejection method) or the like, and drying the coating film of the organic light-emitting layer material. The substrate coated with the organic light-emitting layer material is placed within a vacuum chamber which is being maintained in the vacuum state by a vacuum pump, and undergoes the evacuation process. The period for which the substrate is placed within the vacuum chamber corresponds to, for example, the period for drying the coating film, and the storage period after the formation of the organic light-emitting layer and before the subsequent step.

Here, the expression: "a vacuum chamber which is being maintained in the vacuum state" refers to not only the case where the vacuum chamber is maintained in the complete vacuum state, but also the case where the vacuum chamber is maintained in a state that can be considered as a vacuum state. The expression: "a state that can be considered as a vacuum state" refers to, for example, a state in which the internal pressure of the vacuum chamber is no greater than approximately 1 Pa.

<Difference in Light-Emitting Characteristics Depending on Evacuation Process>

The inventors studied the light-emitting characteristics of the organic EL element as to whether or not the light-emitting characteristics of the organic EL element vary depending on whether or not the evacuation process is performed after the application of the organic light-emitting layer material, and on the type of the vacuum pump. As experimental organic EL elements, three types of organic EL elements were prepared, namely a first type which is an organic EL element not undergoing the evacuation process, and a second and a third type which are organic EL elements undergoing the evacuation process.

Figure 3:
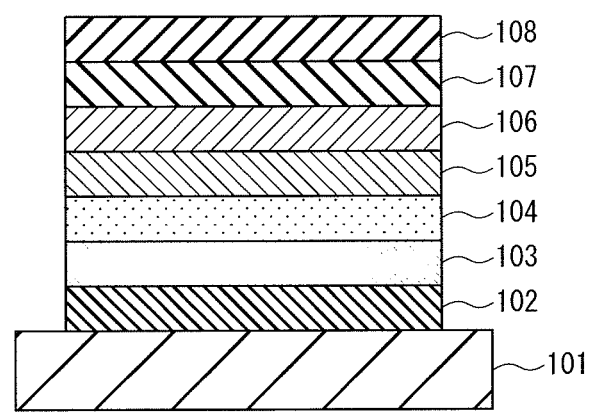
FIG. 3 is a schematic cross-sectional view illustrating the configuration of experimental organic EL elements.

FIG. 3 is a schematic cross-sectional view illustrating the configuration of the experimental organic EL elements. As shown in FIG. 3, each of the experimental organic EL elements has a layered structure, in which an anode 102, a hole injection layer 103, a hole transport layer 104, an organic light-emitting layer 105, an electron transport layer 106, a cathode 107 and a passivation layer 108 are sequentially layered on a substrate 101. There is no difference in configuration between the organic EL element not undergoing the evacuation process and the organic EL elements undergoing the evacuation process.

FIG. 4 is a schematic cross-sectional view illustrating procedures for forming the experimental organic EL elements.

Figure 4A:
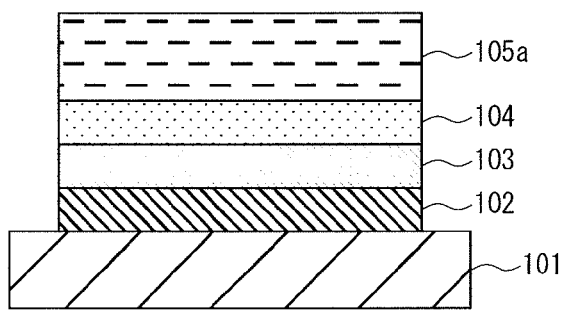
FIGS. 4A through 4D are schematic cross-sectional views illustrating procedures for forming the experimental organic EL elements.
Figure 4B:
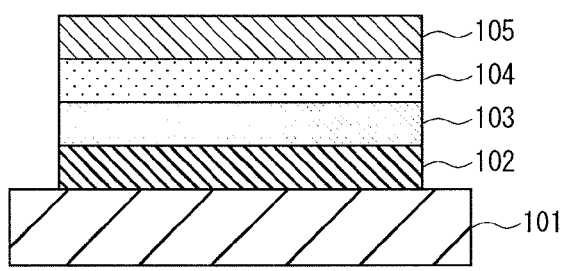

The following describes the organic EL elements undergoing the evacuation process. First, as shown in FIG. 4A, the anode 102, the hole injection layer 103, and the hole transport layer 104 were sequentially layered on the substrate 101, and organic light-emitting layer material 105a was applied onto the upper surface of the hole transport layer 104. Subsequently, the organic light-emitting layer material 105a was dried by applying heat, and the organic light-emitting layer 105 was formed. Thus semi-finished organic EL element products with the organic light-emitting layer 105 were prepared (FIG. 4B).

Figure 4C:
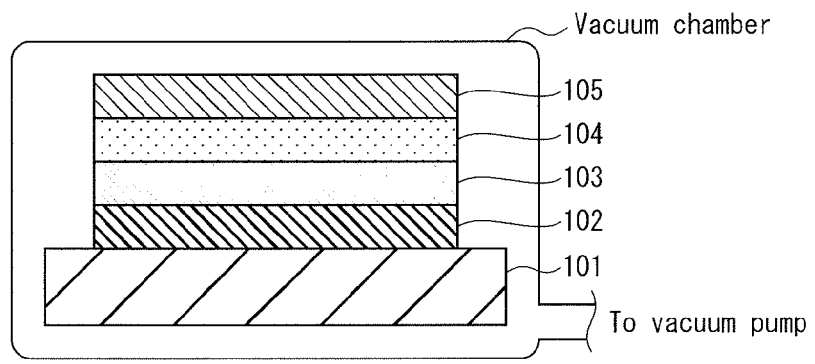

Subsequently, as shown in FIG. 4C, the semi-finished organic EL element products with the organic light-emitting layer 105 were placed within the vacuum chamber connected to a vacuum pump, and the vacuum pump was activated to evacuate the vacuum chamber. The semi-finished products were left as they were for a predetermined period. Two types of vacuum pumps were used in the experiments, namely a mechanical booster pump and a cryogenic pump. One of the experimental organic EL elements undergoing the evacuation process was left for 20 minutes within the vacuum chamber whose internal pressure had been reduced to the performance limit by the mechanical booster pump, and the other was left for 12 hours within the vacuum chamber whose internal pressure had been reduced by the cryogenic pump. Here, regarding the vacuum chamber evacuated by a vacuum pump, the mechanical booster pump and the cryogenic pump were both used as the main pump, and the rough pumping was conducted by using a dry pump that is different from the pumps mentioned above. The transition from the rough pumping by the dry pump to the main pumping was performed before the performance limit of the dry pump had been reached.

Figure 5A:
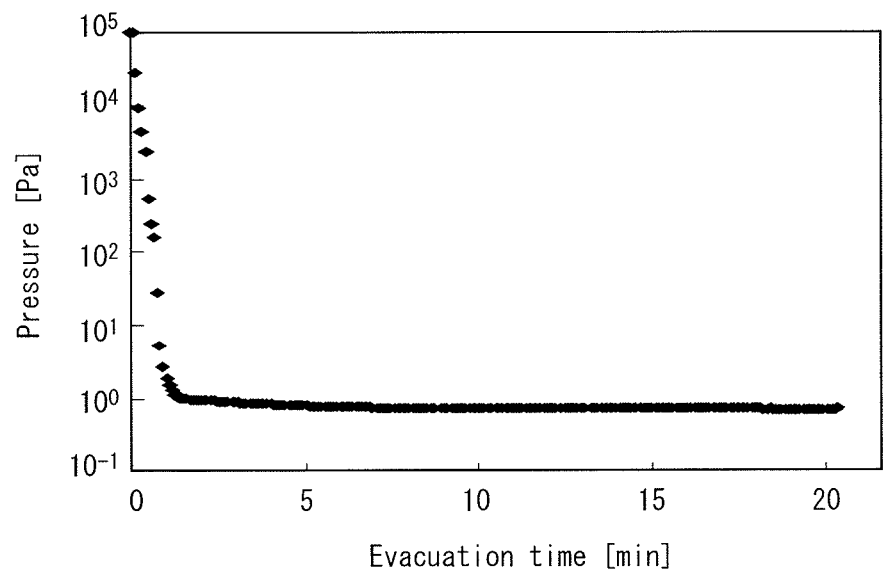
FIG. 5A is a graph illustrating the relationship between the evacuation time and the internal pressure of a vacuum chamber when an experimental mechanical booster pump is used.
Figure 5B:
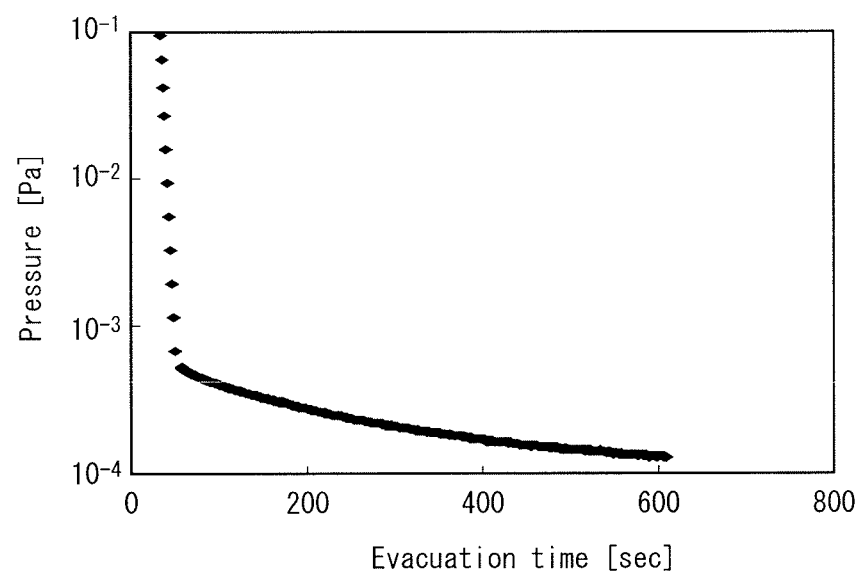
FIG. 5B is a graph illustrating the relationship between the evacuation time and the internal pressure of a vacuum chamber when an experimental cryogenic pump is used.

FIG. 5A is a graph illustrating the relationship between the evacuation time and the internal pressure of the vacuum chamber when the experimental mechanical booster pump is used, and FIG. 5B is a graph illustrating the relationship between the evacuation time and the internal pressure of the vacuum chamber when the experimental cryogenic pump is used. The experiments were conducted by using the pumps that have an exhaust profile as illustrated in FIGS. 5A and 5B. In each graph, the horizontal axis represents the evacuation time of the vacuum pump, and the vertical axis represents the internal pressure of the vacuum chamber.

As shown in FIG. 5A, the internal pressure of the vacuum chamber connected to the mechanical booster pump was reduced to approximately 1 Pa. On the other hand, the internal pressure of the vacuum chamber connected to the cryogenic pump was reduced to approximately $10^4$ to $10^{-5}$ Pa.

Figure 4D:
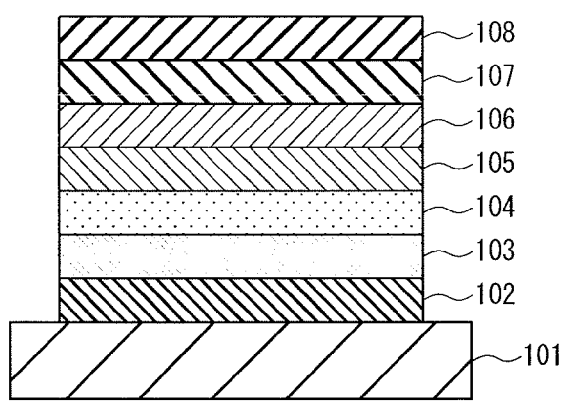

Each semi-finished organic EL element product was taken out of the vacuum chamber, and, as shown in FIG. 4D, the electron transport layer 106, the cathode 107, and the passivation layer 108 were sequentially layered on the organic light-emitting layer 105. Thus the two types of organic EL elements undergoing the evacuation process were manufactured.

The following describes the organic EL element not undergoing the evacuation process. First, as shown in FIG. 4A and FIG. 4B, as with the organic EL elements undergoing the evacuation process, a semi-finished organic EL element product with the organic light-emitting layer 105 was prepared by sequentially layering the anode 102, the hole injection layer 103, the hole transport layer 104 and the organic light-emitting layer 105 on the substrate 101. Subsequently, the semi-finished organic EL element product with the organic light-emitting layer 105 was left within a glovebox, without performing the evacuation process shown in FIG. 4C. Finally, as shown in FIG. 4D, the electron transport layer 106, the cathode 107, and the passivation layer 108 were sequentially layered on the organic light-emitting layer 105. Thus, the organic EL element not undergoing the evacuation process was manufactured.

In all of the organic EL element not undergoing the evacuation process and the organic EL elements undergoing the evacuation process, each of the anode 102, the hole injection layer 103, the hole transport layer 104, the electron transport layer 106, the cathode 107, and the passivation layer 108 is made of known materials. F8-F6 was used as the material of the organic light-emitting layer 105. The methods for forming each layer are not the essence of the experiments. Therefore, explanation of the methods are is omitted here, and will be provided in Embodiment 2.

Needless to say, when manufacturing an organic EL element without performing the evacuation process, it is impossible to drying the organic light-emitting layer material by the evacuation process. Therefore, xylene, which is a low boiling point solvent not requiring drying by the evacuation process, was used for dissolving the material of the organic light-emitting layer. However, when xylene is used as the solvent, application by the ink jet method is not available. Xylene is used only for an experimental purpose. For this reason, when manufacturing the experimental organic EL elements, the organic light-emitting layer material was dried by heating. Furthermore, for the sake of comparison between the experimental organic EL elements, the drying for the organic EL element undergoing the evacuation process was also performed by heating.

Figure 6:
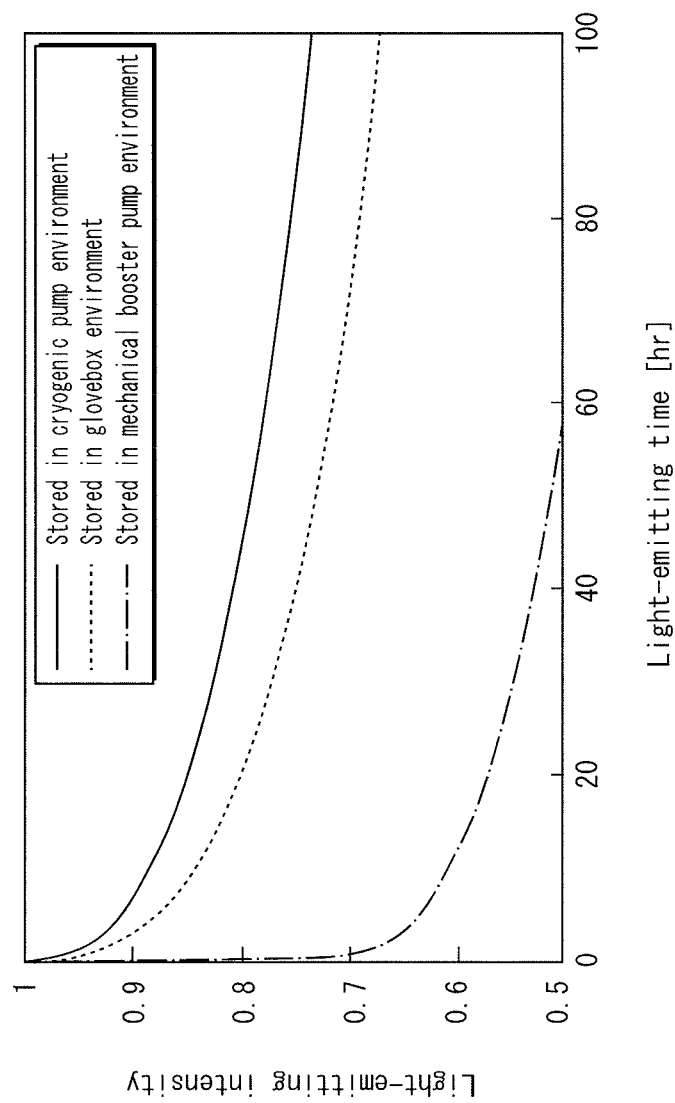
FIG. 6 illustrates light-emitting characteristics of experimental organic EL elements.

FIG. 6 illustrates the light-emitting characteristics of the experimental organic EL elements. FIG. 6 is a graph showing the relationship between the light-emitting time and the light-emitting intensity of the experimental organic EL elements. The horizontal axis represents the light-emitting time (hours), and the vertical axis represents the light-emitting intensity. The light-emitting intensity is represented by a relative value with respect to the light-emitting intensity immediately after the commencement of the light-emission represented by "1". The curve representing the light-emitting characteristics of the organic EL element not undergoing the evacuation process ("Stored in glovebox environment" in FIG. 6) is drawn in a dotted line. The curve representing the light-emitting characteristics of the organic EL element undergoing the evacuation process by the mechanical booster pump ("Stored in mechanical booster pump environment" in FIG. 6) is drawn in a dashed-dotted line, and the curve representing the light-emitting characteristics of the organic EL element undergoing the evacuation process by the cryogenic pump ("Stored in cryogenic pump environment" in FIG. 6) is drawn in a solid line.

As shown in FIG. 6, among the three experimental organic EL elements, the organic EL element stored in the cryogenic pump environment exhibits the smallest decrease in the light-emitting intensity according to the elapse of the light-emitting time. On the other hand, the organic EL element stored in the mechanical booster pump environment exhibits a much larger decrease in the light-emitting intensity according to the elapse of the light-emitting time than the organic EL element stored in the cryogenic pump environment and the organic EL element not undergoing the evacuation process. In other words, the organic EL element stored in the mechanical booster pump environment has a shorter half-life period (the period until the light-emitting intensity is reduced to a half of the original) than the other two elements.

The difference among the experimental organic EL elements lies only in the environment in which the substrate is placed after the formation of the organic light-emitting layer. That is, the half-life period is greatly reduced solely by being stored in the vacuum chamber connected to the mechanical booster pump. Considering this, the inventors of the present invention presumed that some materials used in mechanical vacuum pumps such as the mechanical booster pump serve as impurities and have harmful effects on the organic light-emitting layer.

<Mechanism of Diffusion of Impurities from Mechanical Pump to Vacuum Chamber>

Figure 7:
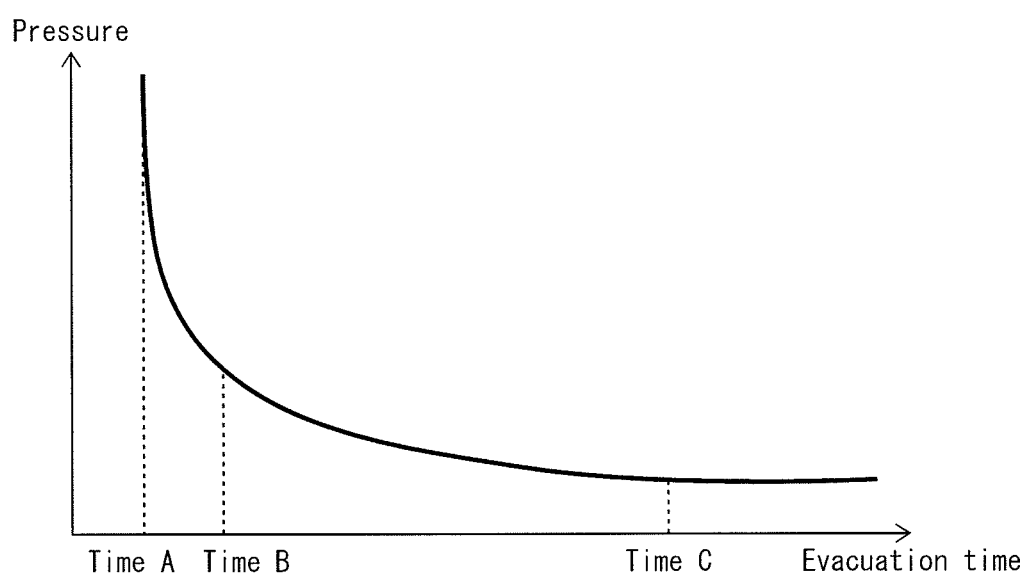
FIG. 7 is a graph illustrating the relationship between the evacuation time and the internal pressure of a vacuum chamber when a mechanical pump is used.

FIG. 7 is a graph illustrating the relationship between the evacuation time and the internal pressure of the vacuum chamber when a mechanical pump is used. The horizontal axis represents the evacuation time and the vertical axis represents the internal pressure of the vacuum chamber. Note that a lower point on the vertical axis indicates a higher degree of vacuum.

Time A corresponds to when the mechanical pump is activated. Time B is in the middle of the progression of the reduction of the internal pressure of the vacuum chamber. At time C, the internal pressure of the vacuum chamber 2 has been reduced to the performance limit of the mechanical pump, and the equilibrium state is reached. The following explains the internal conditions of the vacuum chamber and the mechanical pump at time A, B and C with reference to FIGS. 8A, 8B and 8C.

Figure 8A:
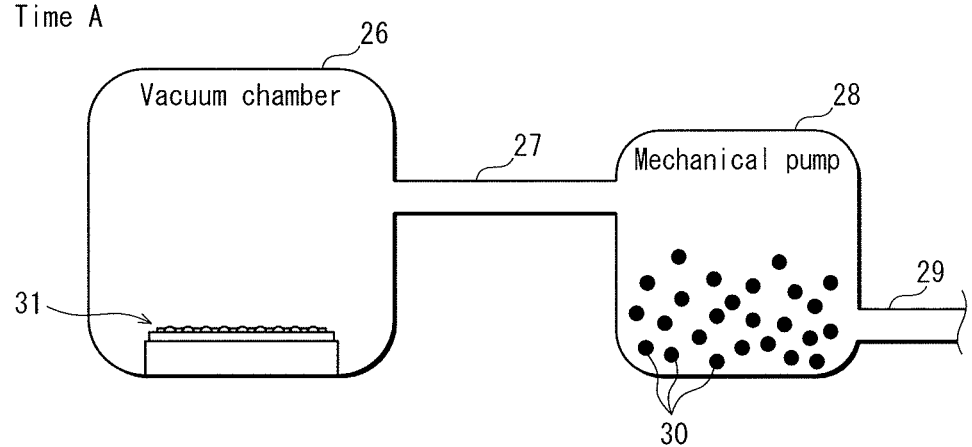
FIGS. 8A through 8C schematically illustrate the internal conditions of the vacuum chamber and the mechanical pump at time A, B and C as shown on the graph in FIG. 10.
Figure 8B:
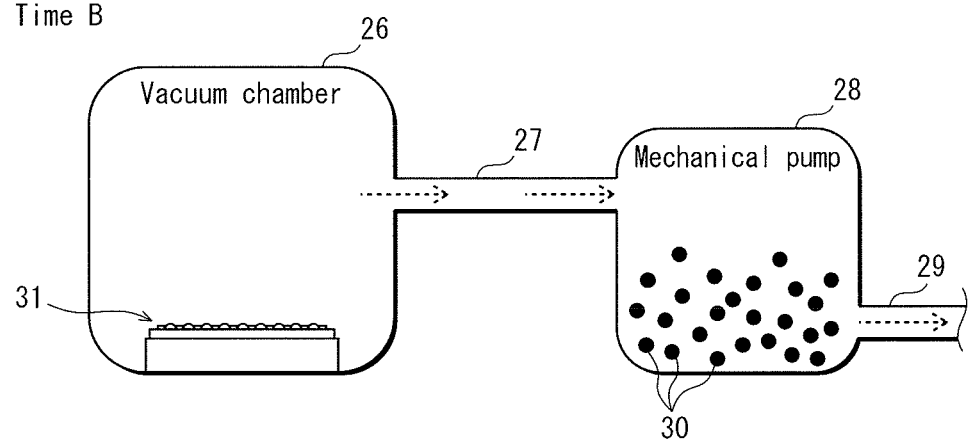
Figure 8C:
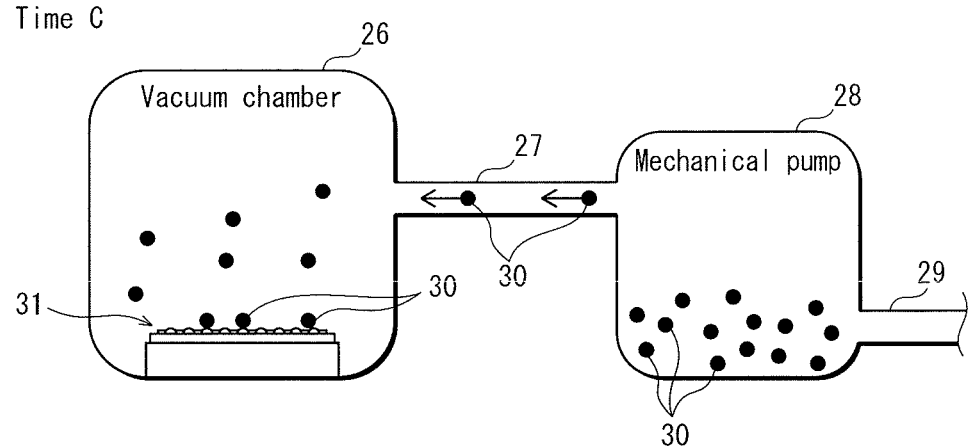

FIGS. 8A, 8B and 8C schematically illustrate the internal conditions of the vacuum chamber and the mechanical pump at time A, B and C as shown on the graph in FIG. 7.

As shown in FIG. 8A thorough 8C, a vacuum chamber 26 is connected to a mechanical pump 28 via an exhaust pipe 27. The gas within the vacuum chamber 26 is discharged by the mechanical pump 28 via the exhaust pipes 27 and 29. In each drawing, some materials used in the mechanical pump 28 are depicted as impurities 30.

FIG. 8A illustrates the situation at the time when the mechanical pump 28 is activated. When the pressure reduction is started, as indicated by the dotted-line arrow in FIG. 8B, the gas within the vacuum chamber 26 is discharged to the outside via the exhaust pipe 27, the mechanical pump 28 and the exhaust pipe 29. Thus, an air flow occurs from the vacuum chamber 26 to the exhaust pipe 27, to the mechanical pump 28, and to the exhaust pipe 29. For this reason, it is presumed that no impurities 30 are flying to the vacuum chamber 26 during the evacuation period (at time B).

At time C, however, the internal pressure of the vacuum chamber 26 has been reduced to the performance limit of the mechanical pump 28. Therefore, the air flow between the vacuum chamber 26 and the mechanical pump 28 is in the equilibrium state. Also, the mean free paths of the impurities 30 are long due to a high degree of vacuum within the vacuum chamber 26 and the mechanical pump 28. The inventors presumed that the impurities 30 fly from the mechanical pump 28 to the vacuum chamber 26 as shown in FIG. 8C for the above-described reasons and consequently adhere to the semi-finished organic EL element product with the organic light-emitting layer. According to the rise in the degree of vacuum of the vacuum chamber 26 and the mechanical pump 28, the proportion of the vapor pressure of the impurities 30 rises with respect to the internal pressure of the vacuum chamber 26 and the mechanical pump 28. This also promotes the diffusion of the impurities 30. Furthermore, when the impurities 30 are flying to the vacuum chamber 26, the mean free paths of the impurities 30 become long due to the high degree of vacuum within the vacuum chamber 26, and therefore the impurities 30 are more likely to collide with the organic light-emitting layer.

Considering the above-described mechanism, the inventors concluded that the backflow of the impurities is cause by that, in the rough pumping, the roughing pump as a mechanical pump is used until the performance limit of the roughing pump is reached. Therefore, the inventors conceived of performing the transition from the rough pumping to the main pumping before the performance limit of the roughing pump is reached.

<Studies of Internal Pressure of Vacuum Chamber During Transition from Rough Pumping to Main Pumping>

The inventors conducted experiments for studying the internal pressure of the vacuum chamber during the transition from the rough pumping to the main pumping. Specifically, the studies were conducted by analyzing the light-emitting characteristics of four types of experimental organic EL elements placed in vacuum chambers each having a different internal pressure.

The organic EL elements used in this experiment were formed in the following manner. First, as with the experimental organic EL elements described above with reference to FIGS. 4A through 4D, semi-finished organic EL element products were each prepared by sequentially layering an anode, a hole injection layer, a hole transport layer and an organic light-emitting layer on a substrate. Next, each semi-finished product was placed within a vacuum chamber connected to a roughing pump (a mechanical booster pump having the exhaust profile shown in FIG. 5A). Subsequently, the internal pressure of the vacuum chamber in which the semi-finished organic EL element product is placed was reduced by the roughing pump to be a predetermined internal pressure, and left as it was for 20 minutes. In the present experiment, four types of elements were prepared with different internal pressures of the vacuum chamber, namely 250 Pa, 15 Pa, 10 Pa, and 5 Pa.

Figure 9:
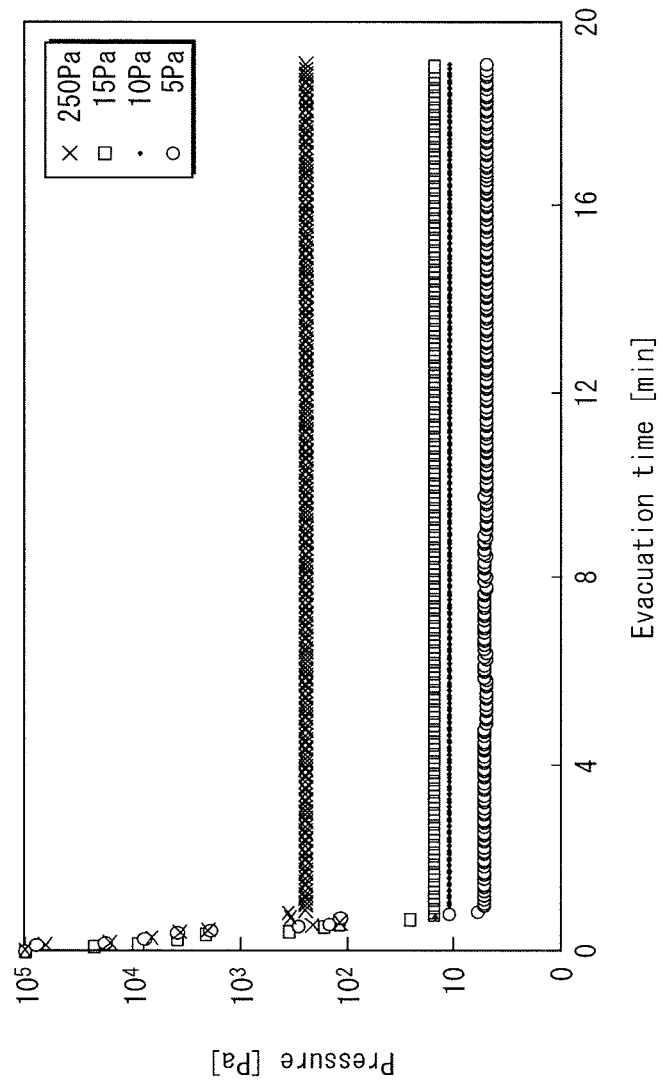
FIG. 9 is a graph illustrating the relationship between the evacuation time and the internal pressure of a vacuum chamber when an experimental roughing pump is used.

FIG. 9 is a graph illustrating the relationship between the evacuation time and the internal pressure of the vacuum chamber when the experimental roughing pump is used. The horizontal axis represents the evacuation time and the vertical axis represents the internal pressure of the vacuum chamber. The cross marks (x) represent the case of the internal pressure of 250 Pa, the square marks (□) represent the case of 15 Pa, the black dot marks (•) represent the case of 10 Pa, and the white circle marks (○) represent the case of 5 Pa. As shown in FIG. 9, the target internal pressure was reached in approximately 1 minute after the commencement of the evacuation regardless of the level of the target internal pressure.

After the evacuation process, the experimental organic EL elements were each completed by sequentially layering the electron transport layer, the cathode and the passivation layer on the organic light-emitting layer.

Figure 10:
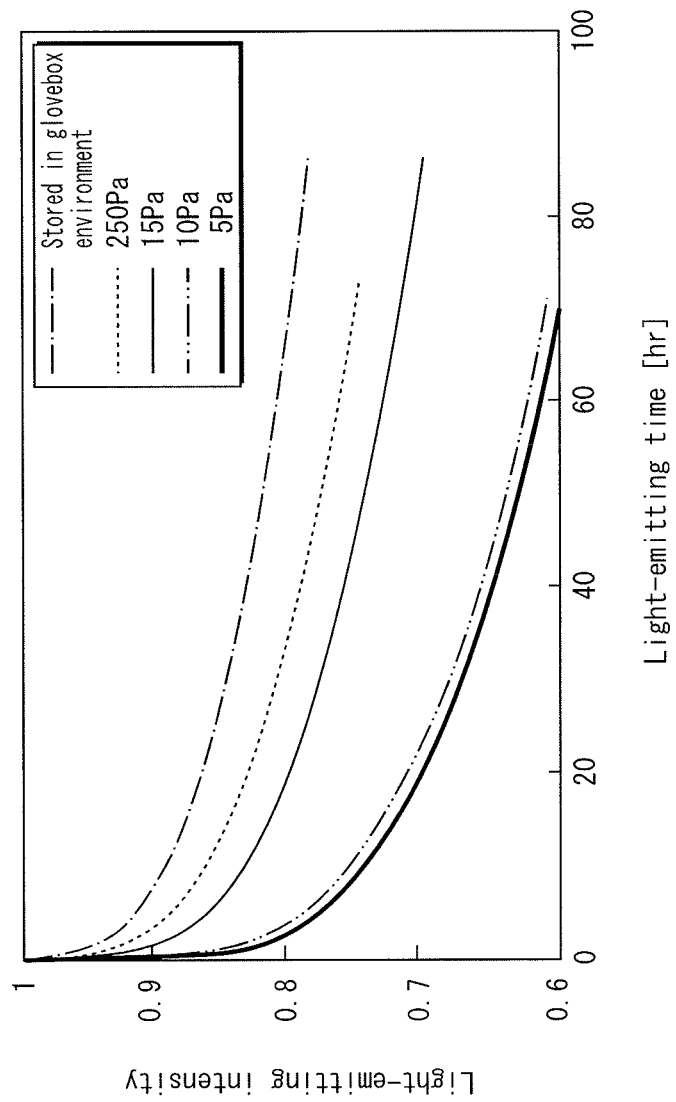
FIG. 10 illustrates light-emitting characteristics of experimental organic EL elements placed within a vacuum chamber with different internal pressures.

FIG. 10 illustrates the light-emitting characteristics of the experimental organic EL elements placed within the vacuum chamber with different internal pressures. FIG. 10 is a graph showing the relationship between the light-emitting time and the light-emitting intensity of the experimental organic EL elements. As with FIG. 6, the horizontal axis represents the light-emitting time (hours), and the vertical axis represents the light-emitting intensity. The light-emitting intensity is represented by a relative value with respect to the light-emitting intensity immediately after the commencement of the light-emission represented by "1".

Regarding the light-emitting characteristics of the experimental elements, the case of the internal pressure of 250 Pa is depicted in dashed line, the case of 10 Pa is depicted in two-dot dashed line, and the case of 5 Pa is depicted in bold line. Also, in FIG. 10, the light-emitting characteristics of the organic EL element not undergoing the evacuation process is depicted in a dashed-dotted line labeled with "Stored in glovebox environment".

As seen from the graph shown in FIG. 10, the internal pressure of the vacuum chamber and the half-life period has a certain correlation. That is, the lower the internal pressure of the vacuum chamber is reduced to be, the shorter half-life period of the light-emitting intensity becomes. It is presumed that the lower the internal pressure of the vacuum chamber is, the larger the amount of impurities flying from the roughing pump to the vacuum chamber, and the further the carrier loss caused by the impurities and the degradation of the materials constituting the organic light-emitting layer progress. In this way, the results of the experiments support the mechanism of the impurities diffusion shown in FIG. 7 and FIGS. 8A through 8C.

Furthermore, the inventors conducted the following experiments as well. The inventors conducted purging using an inert gas in the direction from the vacuum chamber to the vacuum pump, which is the opposite direction as the diffusion of the impurities, and stored an experimental element in the vacuum chamber in which the purging was being conducted. Then, the inventors studied the light-emitting characteristics of the experimental element. As a consequence, the inventors found that the experimental element stored in the vacuum chamber in which the purging had been being conducted had a longer half-life period of the light-emitting intensity compared to the experimental element stored in the vacuum chamber in which the purging had not been being conducted. This result also proves the backflow of the impurities from the vacuum pump to the vacuum chamber.

Also, as shown in FIG. 10, the half-life period of the light-emitting intensity is extremely short when the internal pressure is reduced to 5 Pa and to 10 Pa. On the other hand, when the internal pressure is reduced to 15 Pa, the decrease in half-life period is greatly suppressed compared to when the internal pressure is reduced to 10 Pa. The half-life period is further improved when the internal pressure is reduced to 250 Pa. These results enabled the inventors to conceive of the method for reducing the internal pressure of a vacuum chamber by which the transition from the rough pumping to the main pumping is performed when the internal pressure of the vacuum chamber is no less than 15 Pa.

By performing the transition when the internal pressure of the vacuum chamber is no less than 15 Pa, it is possible to make the transition to the main pumping under the condition that almost no impurities have been diffused inside the vacuum chamber. Here, as seen from the results shown in FIG. 6, it is known that the organic EL element stored in the cryogenic pump environment is prevented from the decrease in light-emitting intensity. Therefore, the condition that almost no impurities have been diffused can be maintained during the main pumping using a non-mechanical pump subsequent to the transition from the rough pumping.

In the storage experiment shown in FIG. 10, the storage time within the vacuum chamber was set to 20 minutes which is relatively long, in order that the influence of the impurities will be noticeable. However, as seen from the exhaust profile shown in FIG. 9, the period from the commencement of the pressure reduction to the transition to the main pumping is at most approximately 2 minutes to 3 minutes when the evacuation process is performed during the manufacturing process of organic EL element products. In other words, the period of the pressure reduction by the mechanical pump is at most approximately 2 minutes to 3 minutes. Therefore, it should be noted that the decrease in light-emitting intensity pertaining to the experimental results shown in FIG. 10 does not occur in the exactly same manner in the final products of the organic EL elements.

Furthermore, in the case of manufacturing practical products of the organic EL elements, the period for which the semi-finished organic EL element products are placed in the vacuum chamber connected to the mechanical pump is very short as already described above. For these reasons, the advantageous effects, namely "it is possible to make the transition to the main pumping under the condition that almost no impurities have been diffused inside the vacuum chamber", can be realized by performing the transition when the internal pressure is no less than 15 Pa as described as to the present embodiment.

<Determination of Transition Timing Based on Evacuation Rate of Roughing Pump>

As described above, the inventors found that it is possible to reduce the amount of impurities that fly to the vacuum chamber due to the use of a roughing pump by performing the transition from the rough pumping to the main pumping when the internal pressure of the vacuum chamber is no less than 15 Pa. The inventors also considered to determine the timing of the transition by using other indices.

According to the present embodiment, the transition is performed when the internal pressure of the vacuum chamber is higher than the performance limit of the roughing pump. As seen from the graph of FIG. 7 showing the relationship between the evacuation time and the internal pressure of the vacuum chamber, the evacuation rate decreases according to the change in internal pressure of the vacuum chamber during the evacuation process. Considering this, the inventors considered it possible to determine the transition timing by using the evacuation rate, separately from the internal pressure of the vacuum chamber.

The inventors calculated the evacuation rate when the internal pressure of the vacuum chamber is 15 Pa with reference to the graph (exhaust profile) shown in FIG. 5A, which shows the relationship between the evacuation time and the internal pressure of the vacuum chamber when the mechanical booster pump is used. As a consequence, the inventors found that the evacuation rate when the internal pressure of the vacuum chamber is 15 Pa is 10 Pa/s.

That is, it is possible to reduce the amount of the impurities that fly to the vacuum chamber due to the use of a roughing pump by performing the transition from the rough pumping to the main pumping when the evacuation rate of the roughing pump is no less than 10 Pa/s.

<Determination of Transition Timing Based on Partial Pressure of Alkanes within Vacuum Chamber>

The inventors studied whether or not differences in storage environment would cause any changes to objects adhering to the surface of the organic light-emitting layer. In the present experiment, the inventors analyzed, for each of three experimental semi-finished organic EL element products, objects adhering to the surface of the organic light-emitting layer.

First, the inventors prepared three semi-finished organic EL element products with the organic light-emitting layer, as with the case of the experimental organic EL elements used for obtaining the graph shown in FIG. 6. Subsequently, each of the three semi-finished organic EL element products was stored in a glovebox, a vacuum chamber connected to a mechanical booster pump, or a vacuum chamber connected to a cryogenic pump for a predetermined period. The storage period in the vacuum chamber connected to the cryogenic pump is 12 hours, and the storage period in the glovebox and the vacuum chamber connected to the mechanical booster pump is 20 minutes. Note that the internal pressure of the vacuum chamber connected to the mechanical booster pump was reduced to approximately 0.6 Pa to 0.7 Pa.

The inventors applied heat to each organic light-emitting layer undergoing the storage process in a helium atmosphere, collected the outgas discharged from the heated organic light-emitting layer was collected by using liquid nitrogen, and analyzed the collected gas by a GC-MS.

Figure 11A:
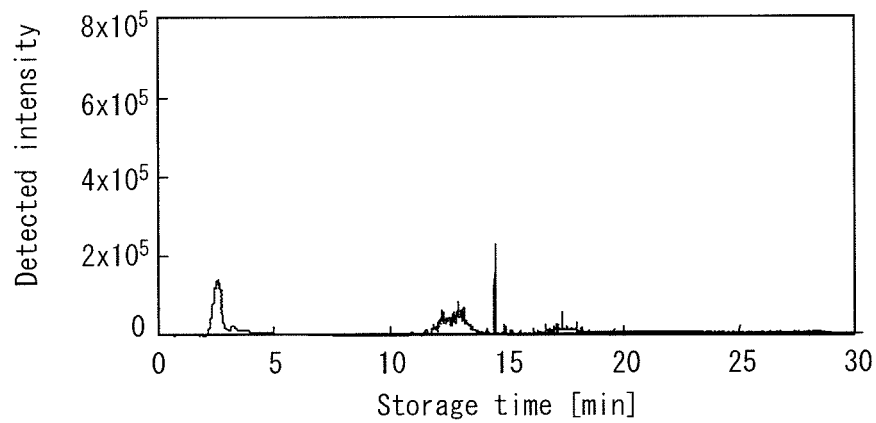
FIGS. 11A through 11C each illustrate analysis results of objects adhering to the surface of an organic light-emitting layer having undergone a different storage process.
Figure 11B:
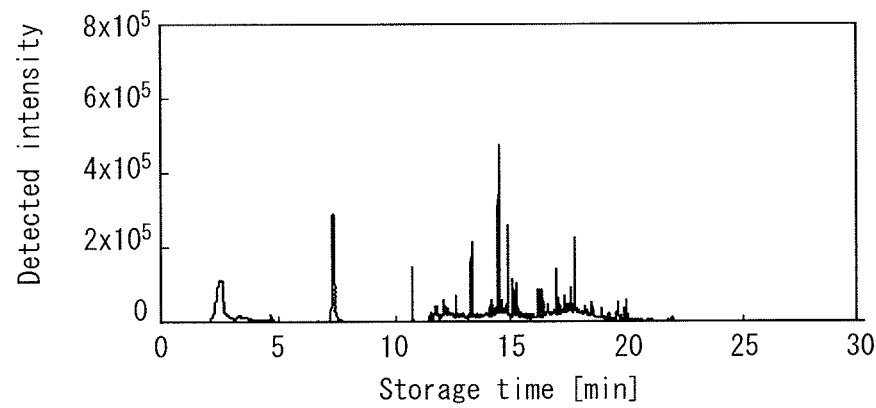
Figure 11C:
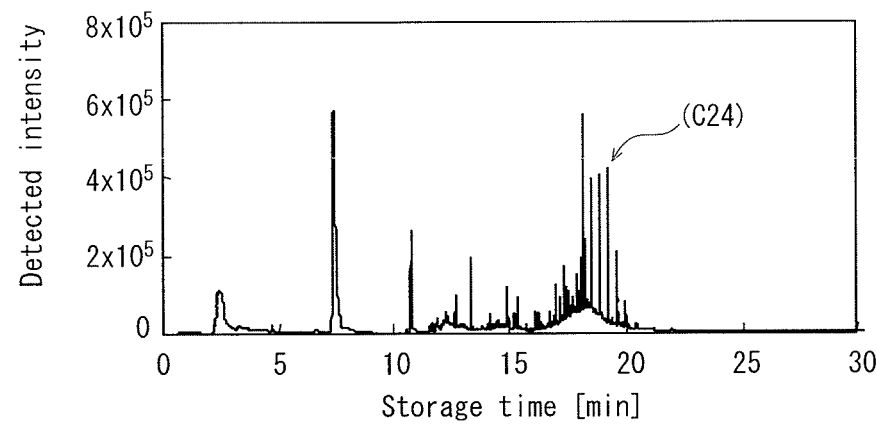

FIGS. 11A through 11C each illustrate the analysis results of objects adhering to the surface of the organic light-emitting layer having undergone a different storage process. The vertical axis represents the detected intensity, and the horizontal axis represents the storage time (minutes). Each of FIGS. 11A through 11C shows the results of gas chromatography when the storage period is within the range of 0 minutes to 30 minutes. FIGS. 11A, 11B, and 11C respectively show the result of the organic light-emitting layer stored in the vacuum chamber connected to the cryogenic pump, the result of the organic light-emitting layer stored in the glovebox, and the result of the organic light-emitting layer stored in the vacuum chamber connected to the mechanical booster pump.

As can be seen from FIGS. 11A through 11C, the organic light-emitting layer stored in the cryogenic pump environment (FIG. 11A) and the organic light-emitting layer stored in the glovebox environment (FIG. 11B) were not so contaminated. In contrast, with respect to the organic light-emitting layer stored in the mechanical booster pump environment (FIG. 11C), a lot of peaks were found in the range of the storage time of approximately 18 minutes to 21 minutes. It was found that these peaks with high intensity correspond to normal alkanes having 20 to 26 carbon atoms.

Note that lubricant is usually used in mechanical vacuum pumps mentioned above. Lubricant usually contains lubricating components such as oil, composed of, for example, normal alkanes having 20 to 26 carbon atoms. The term "alkane" used here means a chain saturated hydrocarbon represented by the general formula $C_nH_{2n+2}$. The term "normal alkane" means an alkane in which the carbon atoms are arranged in a single chain with no branches. The normal alkanes detected in the present analysis, having 20 to 26 carbon atoms, were possibly contained in the lubricating components of the lubricant. It is presumed that the alkanes were detected in the analysis because they flew from the vacuum pump to the vacuum chamber during the evacuation process and adhered to the organic light-emitting layer.

Furthermore, the electron transport layer of each experimental organic EL element used in the experiment shown in FIG. 6 is formed by a vacuum film-forming method. Judging from the fact that the harmful effects on the light-emitting characteristics were found even after the vacuum film-forming process, the impurities were assumed to have a high boiling point so that they do not evaporate even under a high vacuum environment during the vacuum film-forming process. This fact is also not inconsistent with the fact that the impurities are contained in the lubricant.

Among the peaks of the chromatography shown in FIG. 11C detected the range of the storage time of approximately 18 minutes to 21 minutes, the peak indicated by "(C24)" shows the existence of tetracosane (represented by the chemical formula $C_{24}H_{50}$), which is a normal alkane having 24 carbon atoms. Also, as seen from the comparison between the results shown in FIGS. 11A through 11C and the results shown in FIG. 6, there is a correlation between the decrease in half-life period and the intensity of the peak corresponding to tetracosane.

Considering this, the inventors presumed that tetracosane would be useful as the index of the amount of impurities derived from the lubricant. Accordingly, the inventors considered it possible to determine the timing of the transition from the rough pumping to the main pumping based on the ratio of the vapor pressure of tetracosane having flown to the vacuum chamber from the roughing pump relative to the internal pressure of the vacuum chamber (i.e. the partial pressure of tetracosane).

The inventors selected tetracosane for the following reasons, for example: one reason is that values of the vapor pressure of tetracosane were shown in Non-Patent Literature 1; and another reason is that tetracosane presumably has average physical properties of the impurities because the peak corresponding to tetracosane is in the middle of the impurity peaks appearing in the range of the storage time of approximately 18 minutes to 21 minutes.

The inventors decided to obtain the vapor pressure of tetracosane at the internal temperature of the pump that is in its driving state. Generally, the rotors of mechanical pumps such as mechanical booster pumps increase in temperature to approximately 90° C. due to the driving. Considering this, the inventors obtained the vapor pressure of tetracosane at 90° C. with reference to Non-Patent Literature 1.

Figures 12A, 12B:
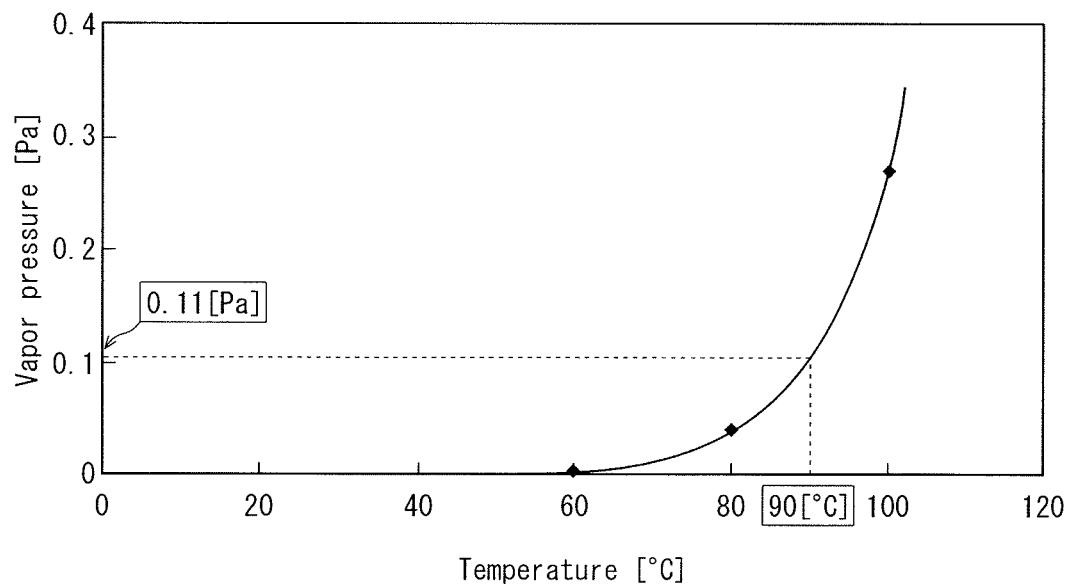
FIG. 12A is a table listing values of the vapor pressure of tetracosane discussed in Non-Patent Literature 1.
FIG. 12B is a graph showing the relationship between the vapor pressure of tetracosane shown in Non-Patent Literature 1 and the temperature corresponding thereto.

FIG. 12A is a table that lists values of the vapor pressure of tetracosane shown in Non-Patent Literature 1. FIG. 12B is a graph showing the relationship between the vapor pressure of tetracosane shown in Non-Patent Literature 1 and the temperature corresponding thereto. In FIG. 12B, the horizontal axis represents the temperature and the vertical axis represents the vapor pressure. The vapor pressure of tetracosane at 90° C. was determined to be 0.11 Pa, which was obtained by drawing an exponential approximation curve with respect to the graph shown in FIG. 12B.

Also, as clearly described above, by performing the transition from the rough pumping to the main pumping when the internal pressure of the vacuum chamber is no less than 15 Pa, it is possible to reduce the amount of at least the impurities caused by the use of a roughing pump from among the impurities flying back from the roughing pump to the vacuum chamber. That is, the partial pressure of tetracosane within the vacuum chamber can be obtained by dividing 0.11 Pa by 15 Pa, and the answer is $7.3 \times 10^{-3}$.

Therefore, it is possible to reduce the amount of the impurities derived from a roughing pump, in particular the lubricant-derived impurities that fly back to the vacuum chamber, by performing the transition from the rough pumping to the main pumping when the ratio of the vapor pressure of the alkanes, which have been contained in the lubricant and have flown to the vacuum chamber from the roughing pump, relative to the internal pressure of the vacuum chamber, is no greater than $7.3 \times 10^{-3}$.

[Method for Detecting Impurities Derived from Vacuum Pump]

During the series of experiments described above, the inventors were led to consider a method for detecting impurities using an organic film as a detector for detecting impurities derived from a vacuum pump. This section explains the background and specific details of the detection method.

(Developments Leading to the Invention)

The inventors found it necessary to put an organic film in the vacuum chamber in order to detect the impurities having flown to the vacuum chamber (FIG. 11). Details regarding this distinction are provided below.

First, the inventors connected a mechanical booster pump to the vacuum chamber, collected the gas from the vacuum chamber having an internal pressure that is equal to the atmospheric pressure, and conducted the GC-MS analysis. However, the inventors failed to detect the impurities by this method, and determined that the problem was that they did not evacuate the vacuum chamber. Accordingly, the inventors placed a glass substrate and a silicon wafer within the vacuum chamber, and collected the gas from the vacuum chamber by using the mechanical booster pump after evacuating the vacuum chamber. Nevertheless, they could not detect the impurities.

Considering these results, the inventors presumed that the object to which the impurities adhere should be an organic film such as an organic light-emitting layer. The inventors placed a substrate coated with organic light-emitting layer material within the vacuum chamber, evacuated the vacuum chamber, and conducted the GC-MS analysis according to the above-described method. As a consequence, the inventors successfully detected the peak of the impurities in the spectrum as shown FIG. 11.

Since the detection of impurities failed when the evacuation process is performed with, for example, a glass substrate, it can be determined that the adhesion of the impurities during the evacuation process is caused because the object undergoing the evacuation process is a coating film made of organic film material, not made of an inorganic material.

(Methods for Detecting Impurities)

First, an organic film serving as a detector is placed within the vacuum chamber, and the vacuum chamber is evacuated. This process establishes an environment in which the impurities derived from the vacuum pump are likely to fly from the vacuum pump to the vacuum chamber. Subsequently, the impurities, which have flown to the vacuum chamber from the vacuum pump, adhere to the organic film. Finally, the impurities adhering to the surface and its proximity of the organic film are analyzed. Examples methods for analyzing the impurities adhering to the surface and its proximity of the organic film include: (1) a method of heating the organic film in a helium atmosphere, collecting the outgas from the organic film thus heated by using liquid nitrogen, and analyzing the outgas; (2) a method of washing the surface of the organic film with a solvent and analyzing the solvent after the washing; and (3) a method of dissolving the organic film in a solvent and analyzing the solvent after the dissolution.

These impurity detection method utilize the fact that the organic film readily absorbs the impurities. Therefore, the methods can be used to detect the impurities even when only a small amount of impurities have flown to the vacuum chamber from the vacuum pump. Furthermore, the methods are broadly applicable to the detection of any impurities in the environment in addition to the impurities caused by the use of a roughing pump (such as lubricant-derived impurities).

Embodiment 2

The present embodiment describes an organic EL display panel, an organic EL display apparatus, and an organic EL light-emitting apparatus each having an organic light-emitting layer formed by using the vacuum apparatus pertaining to Embodiment 1.

[Structure of Organic EL Display Panel]

Figure 13:
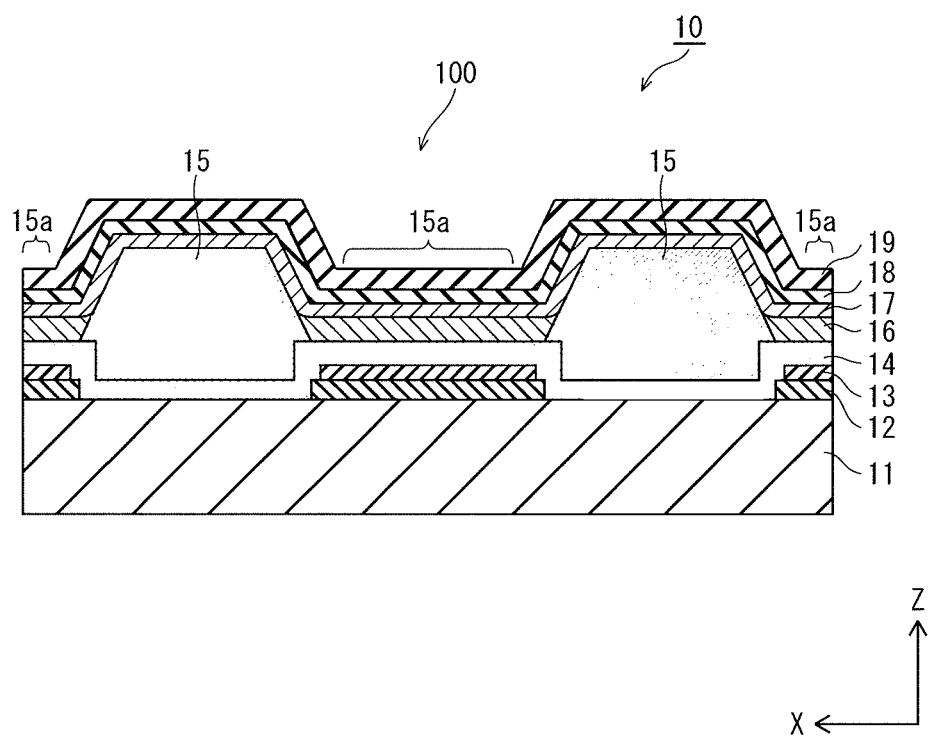
FIG. 13 is a partial cross-sectional view illustrating the configuration of an organic EL display panel 10 pertaining to Embodiment 2.

FIG. 13 is a partial cross-sectional view illustrating the configuration of an organic EL display panel 10. The organic EL display panel 10 is a top-emission organic EL display panel, and the upper surface shown in the figure serves as the display surface. The organic EL display panel 10 includes mainly an anode 12, an organic light-emitting layer 16, an electron transport layer 17 and a cathode 18. In the organic EL display panel 10, a plurality of sub-pixels 100 are arranged in a matrix. Each sub-pixel 100 is composed of an organic EL element having the organic light-emitting layer 16 corresponding to any of luminescent colors, namely red (R), green (G), or blue (G).

<Substrate 11, Anode 12, ITO Layer 13>

The substrate 11 is the base material for the organic EL display panel 10 and may be formed with an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

While not shown in the figures, a TFT (thin film transistor) is provided on the surface of the substrate 11 for driving the organic EL element, with the anode 12 layered thereabove. The anodes 12 may be formed from, for example, ACL (an alloy of aluminum, cobalt and lanthanum), APC (an alloy of silver, palladium and copper), ARA (an alloy of silver, rubidium and gold), MoCr (an alloy of molybdenum and chromium), NiCr (an alloy of nickel and chromium), etc.

The ITO (indium tin complex oxide) layer 13 is provided between the anodes 12 and a hole injection layer 14, and has a function to provide excellent connection between the layers.

<Hole Injection Layer 14>

The hole injection transporting layer 14 is a layer of an oxide such as silver (Ag), molybdenum (Mo), chromium (Cr), vanadium (V), tungsten (W), nickel (Ni), or iridium (Ir), or a conductive polymer material such as PEDOT (a mixture of Polthiophene and polystyrene sulfonate). When formed from a metal oxide among the above-mentioned materials, the hole injection layer 14 has a function to inject holes into the organic light-emitting layer 16 by providing the holes stably or assisting the generation of holes.

<Banks 15>

Banks 15 are provided on the surface of the hole injection layer 14, for partitioning apertures 15a which serve as areas where the organic light-emitting layer 16 is to be formed. The banks 15 are formed to have a predetermined trapezoidal cross section, and are made of an insulating organic material such as acrylic resin, polyimide resin, or novolac-type phenolic resin.

Figure 14:
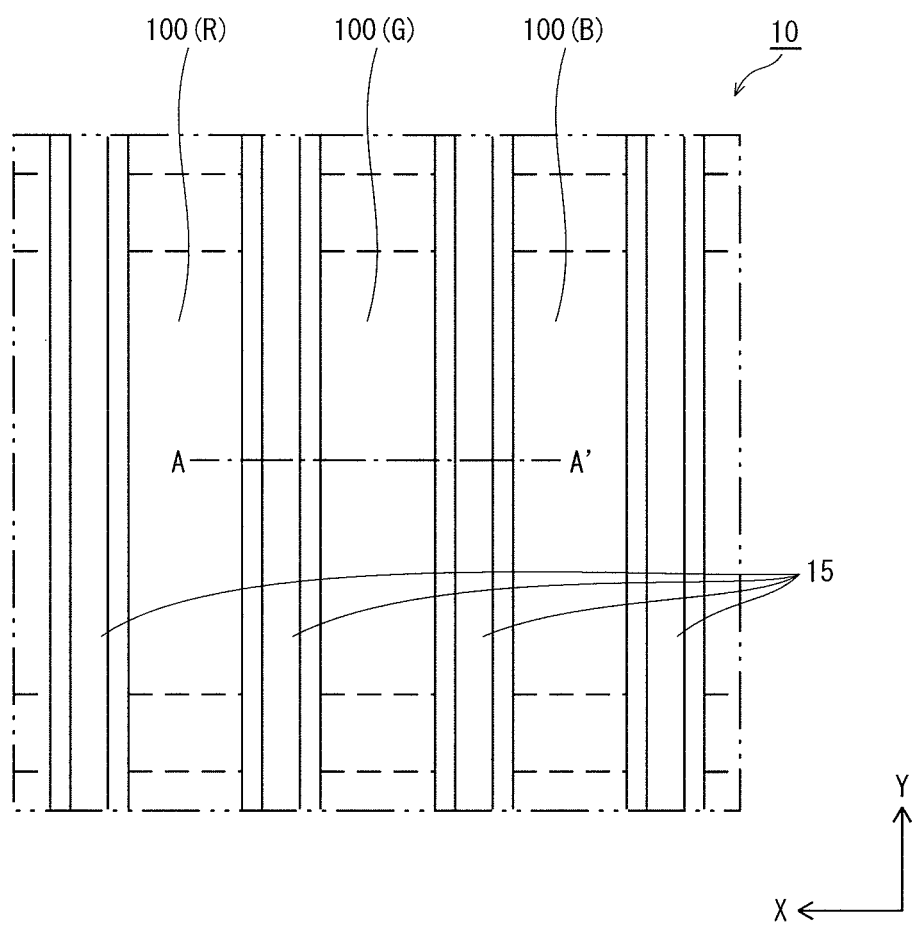
FIG. 14 is a schematic plan view illustrating the configuration of banks 15 of an organic EL display panel 10 pertaining to Embodiment 2.

FIG. 14 is a schematic plan view illustrating the banks 15 of the organic EL display panel 10. In the organic EL display panel 10 pertaining to the present embodiment, the line banks (banks arranged in lines) 15 are adopted as one example. More specifically, each of the banks 15 extends along the Y axis direction and separates the adjacent sub-pixels 100 in the X axis direction. The sub-pixels 100 are formed so that each of the regions separated by the banks 105 emits a different color. For example, one pixel is composed of the combination of three sub-pixels, namely a sub-pixel 100(R) corresponding to the color of red, a sub-pixel 100(G) corresponding to the color of green, and a sub-pixel 100(B) corresponding to the color of blue.

Note that the partial cross-sectional view shown in FIG. 13 is a cross-sectional view along the A-A' line shown in FIG. 14.

<Organic Light-Emitting Layer 16>

Returning to FIG. 13, the surface of the hole injection layer 14 partitioned by the banks 15 into the apertures 15a is coated with the organic light-emitting layer 16 as an organic film. Each portion of the organic light-emitting layer 16 corresponds to the luminescent color of R, G or B. Each portion of the organic light-emitting layer 16 emits light by recombination of carriers, and contains an organic material corresponding to one of the colors R, G and B.

Examples of the material in the organic light-emitting layer 16 include poly-para-phenylene vinylene (PPV), polyfluorene, and a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. 05-163488, in addition to F8-F6 which was used in the experiments pertaining to Embodiment 1.

As described below, the organic light-emitting layer 16 pertaining to the present embodiment is formed by using the vacuum apparatus pertaining to Embodiment 1 and the method pertaining to Embodiment 1 for reducing the internal pressure of a vacuum chamber. Therefore, only a small amount of impurities enter between the organic light-emitting layer 16 and the electron transport layer 17 formed thereon. Therefore, when compared with the case of not undergoing the manufacturing method described below, the organic light-emitting layer 16 is not damaged by the impurities, and achieves characteristics close to the designed values. In addition, the electron transport layer 17 formed above the organic light-emitting layer 16 is prevented from being damaged by the impurities. As a consequence, the organic light-emitting layer 16 pertaining to the present embodiment achieves excellent light-emitting characteristics.

<Electron Transport Layer 17>

The electron transport layer 17 has a function to transport electrons, which are injected from the cathode 18, to the organic light-emitting layer 16. The electron transport layer 17 is formed from a material having electron transportability (electron transporting material), and examples of the electron transporting material include nitro-substituted fluorenone derivative, thiopyran dioxide derivative, diphenoquinone derivative, perylenetetracarboxyl derivative, anthraquinodimethane derivative, fluorenylidenemethane derivative, anthrone derivative, oxadiazole derivative, perynone derivative, quinolone complex derivative, etc. (each recited in Japanese Patent Application Publication No. 05-163488).

<Cathode 18>

In the present embodiment, to realize a top-emission organic EL display panel, the cathode 18, which is formed on the electron transport layer 17, is made of a light-transmissive, conductive oxide such as ITO or IZO (indium zinc oxide).

<Passivation Layer 19>

A passivation layer 19 is formed on the cathode 19 to protect the organic light-emitting layer 16 and the cathode 18 from water or oxygen entering inside the organic EL display panel 10. Since the organic EL display panel 10 is of the top-emission type, the passivation layer 19 is formed from a light-transmissive material such as SiN (silicon nitride) or SiON (silicon oxynitride).

<Other Considerations>

Although not illustrated in particular, a passivation substrate is provided above the passivation layer 19 so as to face the substrate 11. Furthermore, a space formed between the passivation layer 19 and the passivation substrate may be filled with insulating material. This configuration prevents water or oxygen from entering inside the organic EL display panel 10. Since the organic EL display panel 10 is of the top-emission type, the insulative material needs to be a light-transmissive material such as SiN or SiON.

Furthermore, a hole transport layer, which has a function to promote transportation of holes from the hole injection layer 14 to the organic light-emitting layer 16, may be additionally formed between the hole injection layer 14 and the organic light-emitting layer 16. Examples of possible materials of the hole transport layer include triazole derivative, oxadiazole derivative, imidazole derivative, polyarylalkane derivative, pyrazoline derivative and pyrazolone derivative, phenylenediamine derivative, arylamine derivative, amino-substituted chalcone derivative, oxazole derivative, styrylanthracene derivative, fluorenone derivative, hydrazone derivative, stilbene derivative, porphyrin compound, aromatic tertiary amine compound, styrylamine compound, butadiene compound, polystyrene derivative, hydrazone derivative, triphenylmethane derivative, and tetraphenyl benzine derivative (each recited in Japanese Patent Application Publication No. 05-163488).

Furthermore, an electron injection layer, which has a function to promote injection of electrons from the cathode 18 to the electron transport layer 17, may be additionally formed between the electron transport layer 17 and the cathode 18. Examples of possible materials of the electron injection layer include barium, phthalocyanine, lithium fluoride, etc.

[Method for Manufacturing Organic EL Display Panel]

FIGS. 15 through 17 illustrate example processes for manufacturing the organic EL display panel 10 pertaining to Embodiment 2. The following describes the processes for manufacturing the organic EL display panel 10 with reference to these figures.

<Preparation Process>

First, a preparation process is performed to prepare the substrate 11, by which the anode 12 is formed on the upper surface of the substrate 11, and the organic light-emitting layer material containing the material of the organic light-emitting layer 16 and the solvent is provided above the anode 12. FIGS. 15A through 16A correspond to the preparation process.

Figure 15A:
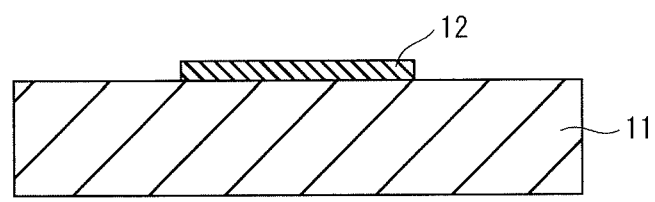
FIGS. 15A through 15C illustrate example processes for manufacturing the organic EL display panel 10 pertaining to Embodiment 2.

First, as shown in FIG. 15A, the substrate 11 is placed in a film-forming container of a sputtering apparatus for film formation. A predetermined sputtering gas is introduced into the film-forming container, and the anode 12 is formed by a reactive sputtering method, a vacuum deposition method, or the like.

Figure 15B:
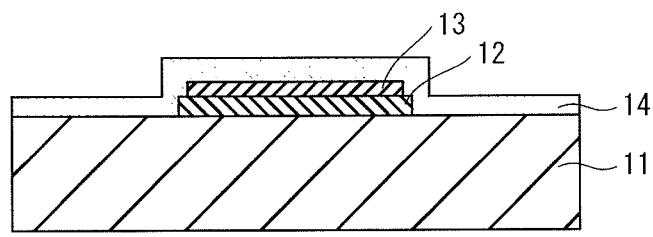

Subsequently, as shown in FIG. 15B, the ITO layer 13 is formed on the anode 12 in the film-forming container by a sputtering method. Subsequently, a metal film is formed on the surface of the substrate 11 by a sputtering method or the like so as to cover the surface of each portion of the ITO layer 13. Then, the hole injection layer 14 is formed by oxidizing the metal film thus formed.

Figure 15C:
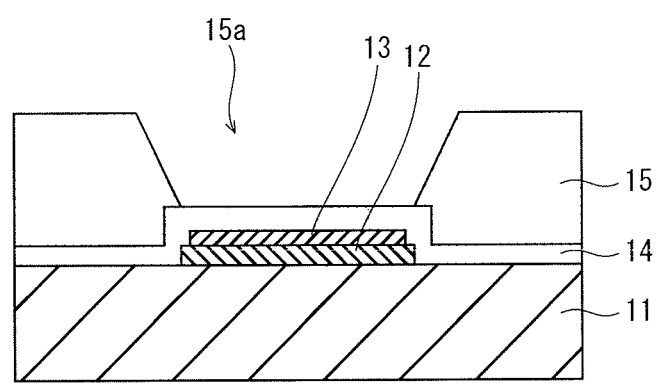

Next, as shown in FIG. 15C, the banks 15 are formed. As the bank material, a photosensitive resist material for example, preferably a photoresist material containing a fluorine-based material, is prepared. The bank material is uniformly applied to the surface of the hole injection layer 14. After the bank material is pre-baked, a mask with a pattern for forming the apertures 15a is overlaid thereon. Subsequently, the hole injection layer 14 is exposed to light projected from above the mask, and unhardened, excess bank material is washed off with a developer. Finally, the banks 15 are completed by rinsing with pure water.

Note that the hole transport layer is formed as necessary after forming the banks 15 and before forming the organic light-emitting layer 16. As with the organic light-emitting layer 16 described below for example, the hole transport layer may be formed by a coating film formation method.

Figure 16A:
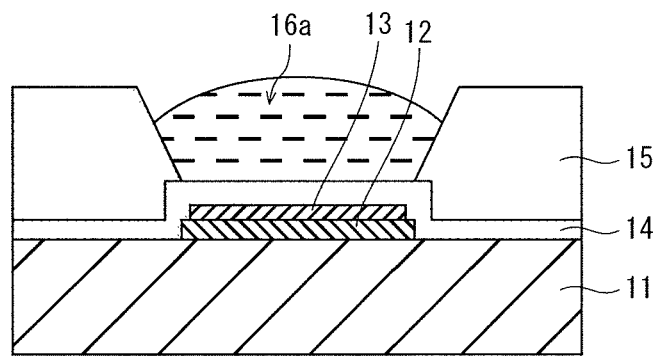
FIGS. 16A through 16C illustrate example processes for manufacturing the organic EL display panel 10 pertaining to Embodiment 2.
Figure 16B:
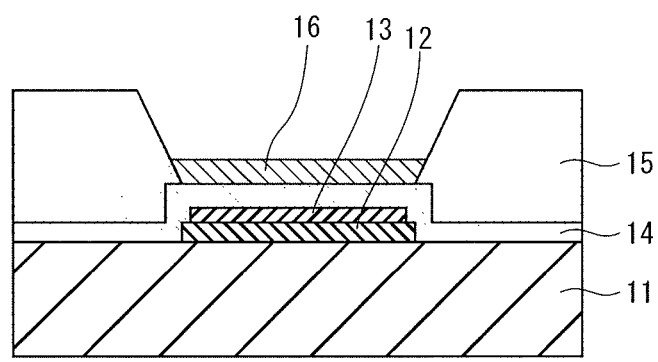

Next, as shown in FIG. 16A, an organic light-emitting layer material 16a containing the material of the organic light-emitting layer and the solvent is dripped into the aperture 15a (FIG. 15C) by an inkjet method. Through these processes, the substrate 11 is prepared, with the anode 12 formed on the upper surface of the substrate 11, and the organic light-emitting layer material containing the material of the organic light-emitting layer 16 and the solvent provided above the anode 12. Note that the method for dripping the organic light-emitting layer material 16a is not limited to the ink jet method, but may be, for example, a gravure printing method, a dispenser method, a nozzle coating method, an intaglio printing method, or a relief printing method.

The substrate with the organic light-emitting layer material applied to above the anode and containing the material of the organic light-emitting layer and the solvent, as described above, is not limited to the substrate in which the organic light-emitting layer material is applied directly to the anode, and may be a substrate in which the organic light-emitting layer material is applied indirectly to the anode. That is, another layer may be provided between the anode and the organic light-emitting layer material. The substrate prepared by the preparation process pertaining to the present embodiment includes the ITO layer 13 and the hole injection layer 14 between the anode 12 and the organic light-emitting layer material 16a.

<Drying Process>

In the drying process (FIG. 16B) as the evacuation process, the coating film of the organic light-emitting layer material 16a is dried by using the vacuum apparatus pertaining to Embodiment 1 and the method pertaining to Embodiment 1 for reducing the internal pressure of a vacuum chamber. Specifically, the substrate 11 coated with the organic light-emitting layer material 16a is placed in the vacuum chamber, and the vacuum chamber is evacuated by the roughing pump and the main pump connected to the vacuum chamber.

The drying process pertaining to the present embodiment includes: rough pumping by which the vacuum chamber is evacuated by a roughing pump which is a mechanical pump capable of reducing the internal pressure of the vacuum chamber to be less than 15 Pa; and main pumping by which the vacuum chamber after the rough pumping is evacuated by a main pump which is a non-mechanical pump. Furthermore, as described in Embodiment 1, the transition from the rough pumping to the main pumping is performed when the internal pressure of the vacuum chamber is no less than 15 Pa. As a consequence, among the impurities flying back from the roughing pump to the vacuum chamber, at least the impurities caused by the use of the roughing pump is decreased in amount to the extent that the impurities have no influence on the coating film of the organic light-emitting layer material 16a.

The coating film of the organic light-emitting layer material 16a, which is the object to which the impurities adhere, is, for example, the organic light-emitting layer 16 formed via the drying process, or the coating film of the organic light-emitting layer material 16a in the middle of the drying. In the present embodiment, it is assumed that "the coating film of the organic light-emitting layer material 16a" is the organic light-emitting layer 16 formed via the drying process.

The organic light-emitting layer 16 is formed by the drying process, which dries the coating film of the organic light-emitting layer material 16a formed above the substrate 11. At this point, the surface of the organic light-emitting layer 16 as the coating film of the organic light-emitting layer material 16a is free from the adhesion of at least the impurities caused by the use of the roughing pump. Therefore, the stated process prevents the organic light-emitting layer 16 from being left with the impurities adhering thereto caused by the use of the roughing pump, or from being coated with another layer (e.g. the electron transport layer in the present embodiment) with the impurities adhering to the upper surface of the organic light-emitting layer 16.

Note that even when the surface of the organic light-emitting layer 16 is left with impurities adhering thereto, the impurities have only a small influence on the organic light-emitting layer 16 insofar as not being supplied with electric power. Presumably, this is for the reason, for example, that the impurities only physically adhere to the surface and its proximity of the organic light-emitting layer 16, and they do not chemically react with the material of the organic light-emitting layer 16.

<Electron Transport Layer Forming Process, Cathode Forming Process, Etc.>

Figure 16C:
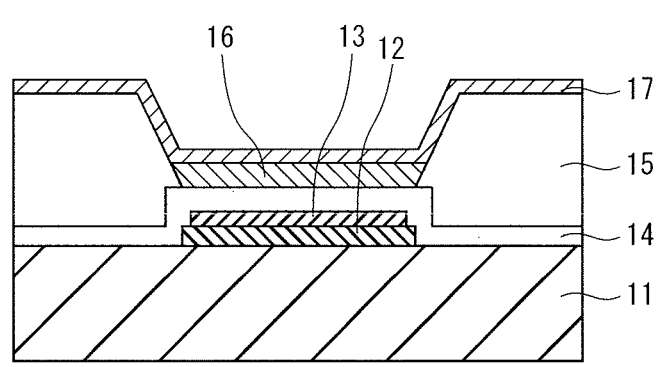

After the drying process, the electron transport layer 17 is formed on the organic light-emitting layer 16 by the vacuum film-forming method as shown in FIG. 16C. Specifically, the electron transport layer 17 is formed by coating the upper surface of the organic light-emitting layer 16 with the material of the electron transport layer 17 by a vacuum film-forming method such as the vacuum deposition method, the sputtering method or the like.

During the electron transport layer forming process, the proportion of the vapor pressure of the electron transporting material to the internal pressure of the film-forming container is significantly high, and the proportion of the vapor pressure of the impurities is substantially 0%. Therefore, there is no risk of the impurities caused by the use of the roughing pump adhering to the surface of the organic light-emitting layer 16. In addition, it is preferable that a non-mechanical pump such as a cryogenic pump is used in the vacuum film-forming process instead of a mechanical pump. This configuration prevents, in the first place, the impurities derived from the vacuum pump from flying to the film-forming container. The method pertaining to Embodiment 1 for reducing the internal pressure of a vacuum chamber may be applied to the evacuation process in the electron transport layer forming process as well.

The electron injection layer is formed as necessary, after the process of forming the electron transport layer 17 and before the process of forming the cathode 18. The electron injection layer can be formed from a material having electron injection properties by a vacuum film-forming method such as the vacuum deposition method or the sputtering method.

Figure 17A:
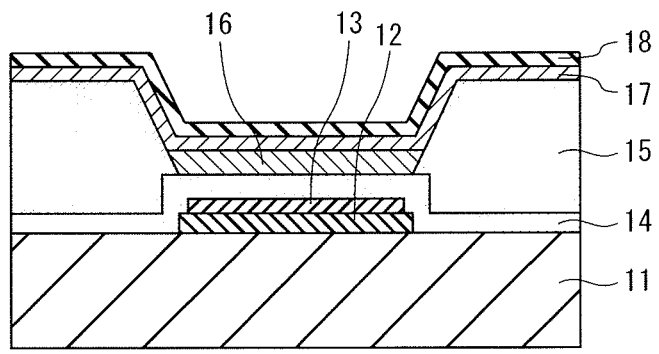
FIGS. 17A and 17B illustrate example processes for manufacturing the organic EL display panel 10 pertaining to Embodiment 2.

Next, the cathode forming process is performed (FIG. 17A). In this process, the cathode 18 is formed by forming a film of ITO, IZO or the like above the organic light-emitting layer 16 as a coating film, by the vacuum film-forming method such as the vacuum deposition method or the sputtering method.

The formation of the cathode above the coating film is not limited to the case of forming the cathode directly on the coating film, and may be the case of forming the cathode indirectly on the coating film. That is, a process for forming another layer may be performed between the evacuation process and the cathode forming process. When the process for forming another layer is performed between the evacuation process and the cathode forming process, the layer is interposed between the coating film and the cathode in the semi-finished product of the organic EL element after the formation of the cathode. In the semi-finished product of the organic EL element in the present embodiment, the electron transport layer 17 is interposed between the organic light-emitting layer 16 as the coating film and the cathode 18. Therefore, the cathode 18 is formed on the upper surface of the electron transport layer 17.

Figure 17B:
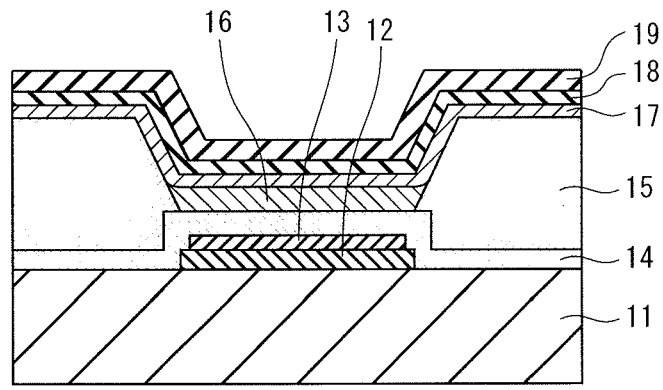

After the completion of the cathode forming process, the passivation layer 19 is formed on the cathode 118 by the vacuum deposition method, the sputtering method or the like as illustrated in FIG. 17B. Subsequently, the passivation substrate is placed above the passivation layer 19 so as to face the passivation layer 19, and, as necessary, a space formed between the passivation layer 19 and the passivation substrate is filled with an insulating material.

Performance of the above processes completes the organic EL display panel 10.

[Organic EL Display Apparatus]

Figure 18:
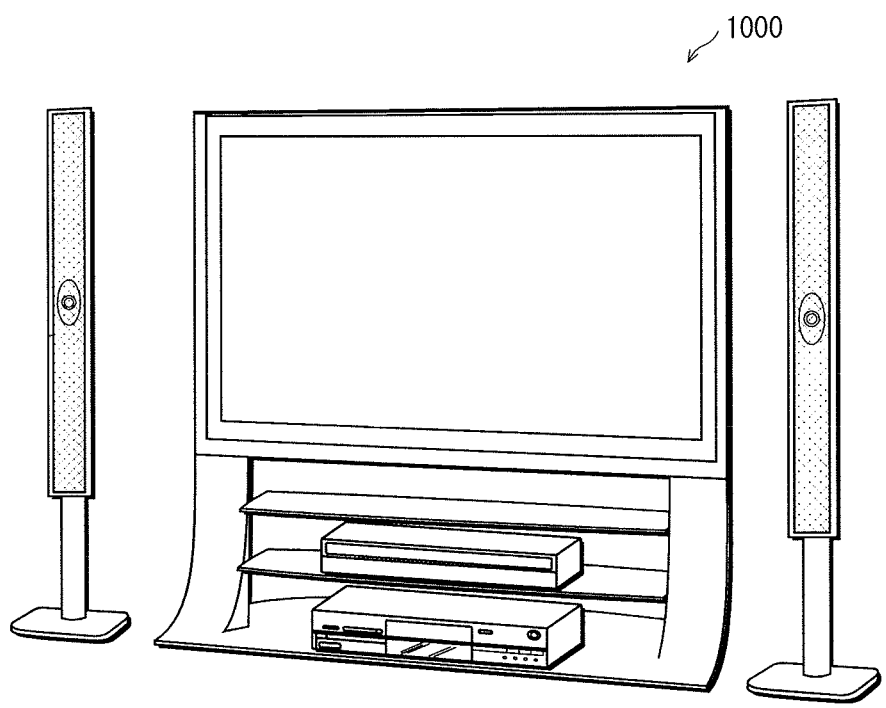
FIG. 18 is a perspective view illustrating an organic EL display apparatus pertaining to one aspect of the present invention.

FIG. 18 is a perspective view illustrating an organic EL display apparatus and so on pertaining to one aspect of the present invention. As shown in FIG. 18, the organic EL display apparatus 1000 is an organic EL display, and includes the organic EL display panel 10 described above.

Figure 19:
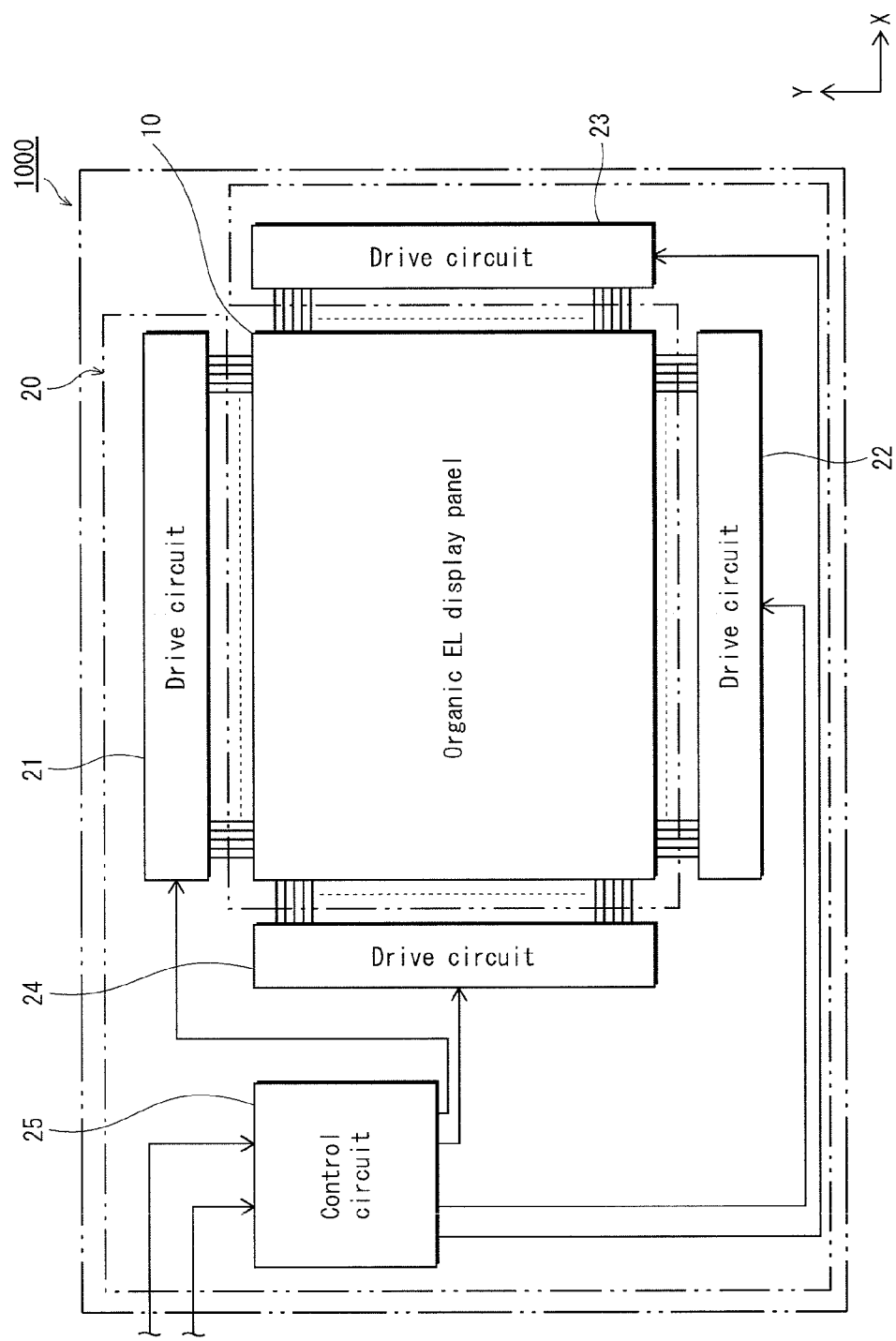
FIG. 19 illustrates the overall configuration of an organic EL display apparatus 1000 pertaining to one aspect of the present invention.

FIG. 19 is a diagram illustrating the overall configuration of the organic EL display apparatus 1000 according to an aspect of the present invention. As shown in FIG. 19, the organic EL display apparatus 1000 includes the organic EL display panel 10 and a drive controller 20 connected thereto. The drive controller 20 is composed of four drive circuits 21 through 24 and a control circuit 25. Note that the positional relationship and the connections of the drive controller 20 to the organic EL display panel 10 are not limited to those illustrated in the drawing.

Each organic EL elements constituting the organic EL display panel 10 included in the organic EL display apparatus 1000 has the organic light-emitting layer formed via the above-described evacuation process. Since the organic light-emitting layer has excellent light-emitting characteristics, the organic EL display apparatus 1000 has excellent image quality.

[Organic EL Light-Emitting Apparatus]

Figure 20A:
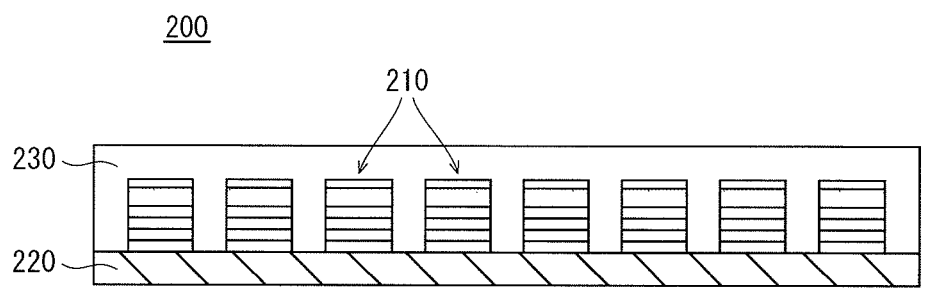
FIGS. 20A and 20B illustrate an organic EL light-emitting apparatus 200 pertaining to one aspect of the present invention.
Figure 20B:
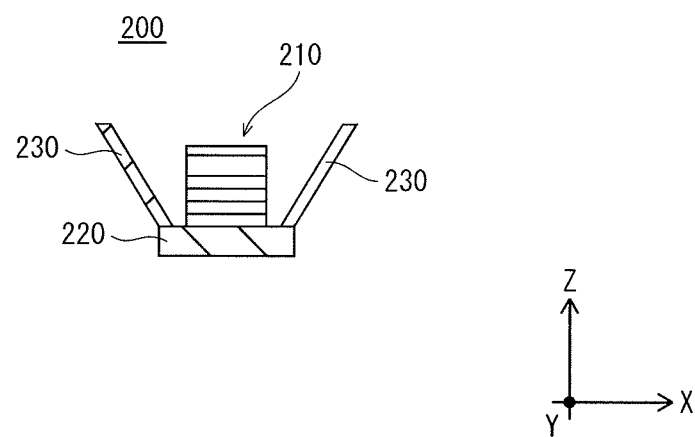

FIGS. 20A and 20B illustrate an organic EL light-emitting apparatus 200 pertaining to one aspect of the present invention. FIG. 20A is a vertical cross-sectional view, and FIG. 20B is a horizontal cross-sectional view. As shown in FIGS. 20A and 20B, the organic EL light-emitting apparatus 200 includes: a plurality of organic EL elements 210 formed by the manufacturing method pertaining to one aspect of the present invention; a base 220 having an upper surface on which the organic EL elements 210 are mounted; and a pair of reflectors 230 attached to the base 220, with the organic EL elements 210 interposed therebetween. Each organic EL element 210 is electrically connected to a conductive pattern (not illustrated) formed on the base 220 and emits light on power supplied via the conductive pattern. A portion of the light emitted from each organic EL element 210 is reflected off the reflector 230, whereby the light distribution is controlled.

Each organic EL element 210 included in the organic EL light-emitting apparatus 200 has the organic light-emitting layer formed via the above-described evacuation process. Therefore, the organic EL light-emitting apparatus 200 has excellent light-emitting characteristics.

[Modifications and Other Matters]

The present invention has been described above based on embodiments. However, the present invention is not limited to any of the above-described embodiments. For example, the following modifications may be considered.

(1) According to Embodiment 1, the experiments were conducted with a vacuum chamber enclosing organic EL elements. However, the objects possibly influenced by the impurities caused by the use of the roughing pump is not limited to organic EL elements. The method pertaining to the present invention for reducing the internal pressure of a vacuum chamber, and the vacuum apparatus pertaining to the present invention, are broadly applicable regardless of the objects enclosed in the vacuum chamber.

(2) The studies by the inventors of the present invention revealed that the internal pressure of the vacuum chamber at which the transition from the rough pumping to the main pumping is to be performed is no less than 15 Pa when the object enclosed within the vacuum chamber is an organic EL element, which readily absorbs impurities. However, it can be presumed that when the object is unlikely to absorb impurities (such as a polymer film), the impurities do not have significant influence on the object, even if there is an increase in amount of impurities flying from the roughing pump to the vacuum chamber. In other words, when the object is unlikely to absorb impurities, it is possible to reduce the internal pressure of the vacuum chamber to be less than 15 Pa by the rough pumping, and then to switch to the main pumping. In this way, it is possible to adjust the timing of the transition with consideration of the absorptive property of the object with respect to impurities.

In addition, the structure and properties of impurities might change depending on the type, for example, of the vacuum pump. It can be presumed that impurities having a low vapor pressure are more unlikely to fly off than impurities having a high vapor pressure under high-vacuum or ultra-high vacuum conditions. Therefore, when impurities have a low vapor pressure, it is possible to reduce the internal pressure of the vacuum chamber to be less than 15 Pa by the rough pumping. In this way, it is possible to adjust the timing of the transition with consideration of the structure and properties of the impurities.

(3) It is stated above that in order to detect the impurities derived from the vacuum pump, it is necessary to enclose an organic film within the vacuum chamber. However, an organic film is required for only the "detection" of the impurities. That is, even when the enclosed object is of a sort from which impurities cannot be detected, the object is presumably under the influence of the impurities.

(4) The vacuum apparatus shown in FIG. 1 is merely an example. The vacuum apparatus pertaining to the present invention is not limited to this example. For example, the gas inflow valve 8 shown in FIG. 1 is not an essential component for exploitation of the present invention. Furthermore, additional components other than the components shown in FIG. 1 may be included in the present invention.

Figure 21:
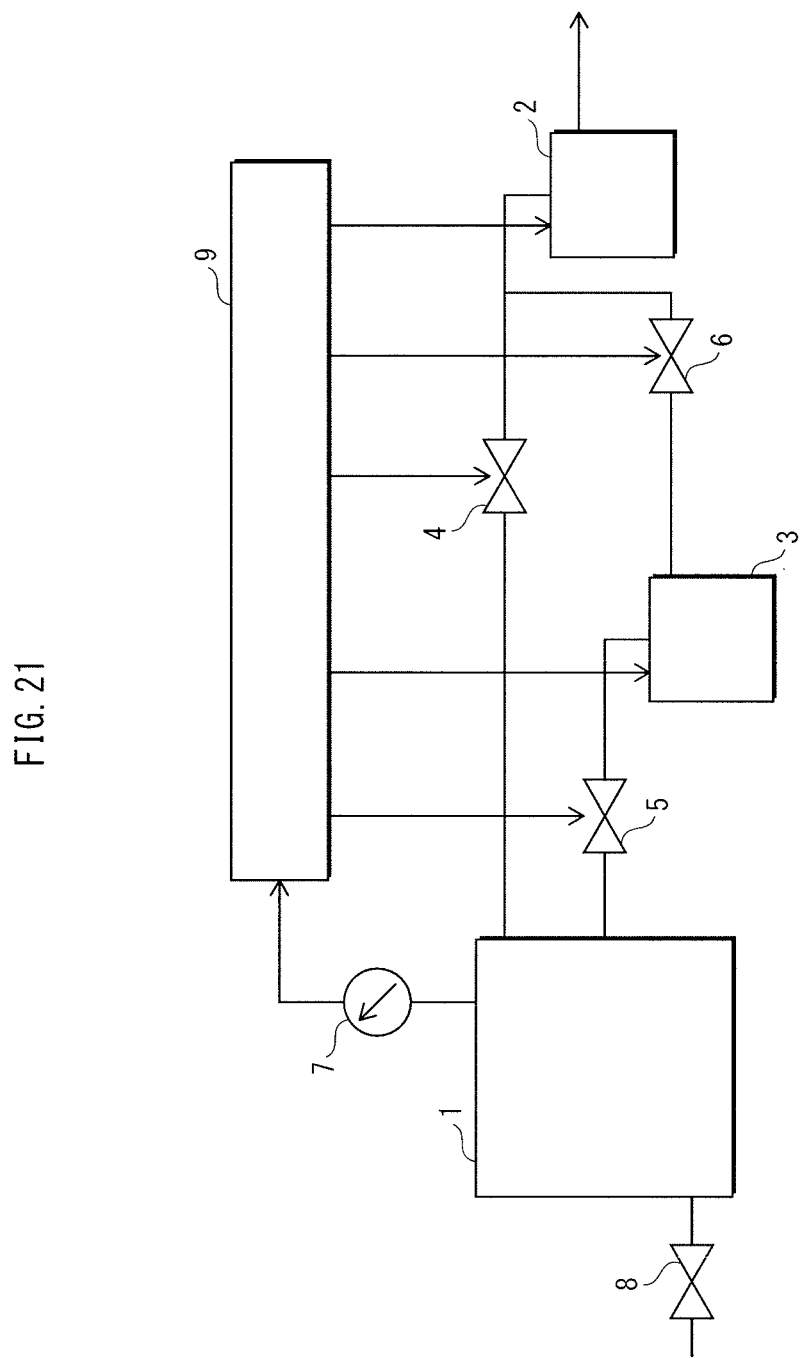
FIG. 21 shows the configuration of a vacuum apparatus pertaining to a modification.

(5) FIG. 21 shows the configuration of a vacuum apparatus pertaining to a modification The following describes mainly the differences from Embodiment 1 (FIGS. 1 and 2).

The configuration of the vacuum apparatus pertaining to the modification is different from the vacuum apparatus pertaining to Embodiment in that the main exhaust pipe extending from the vacuum chamber 1 to the main pump 3 further extends from the main pump 3 to the roughing pump 2, and that a valve 6 for opening or closing the extended main exhaust pipe is additionally provided. The valve 6 for the extended main exhaust pipe is used during the main pumping. In the following, the valve 6 for the extended main exhaust pipe is referred to as the main valve 6. The controller 9 controls the operations of the main valve 6 in addition to the operations described in Embodiment 1.

Figure 22:
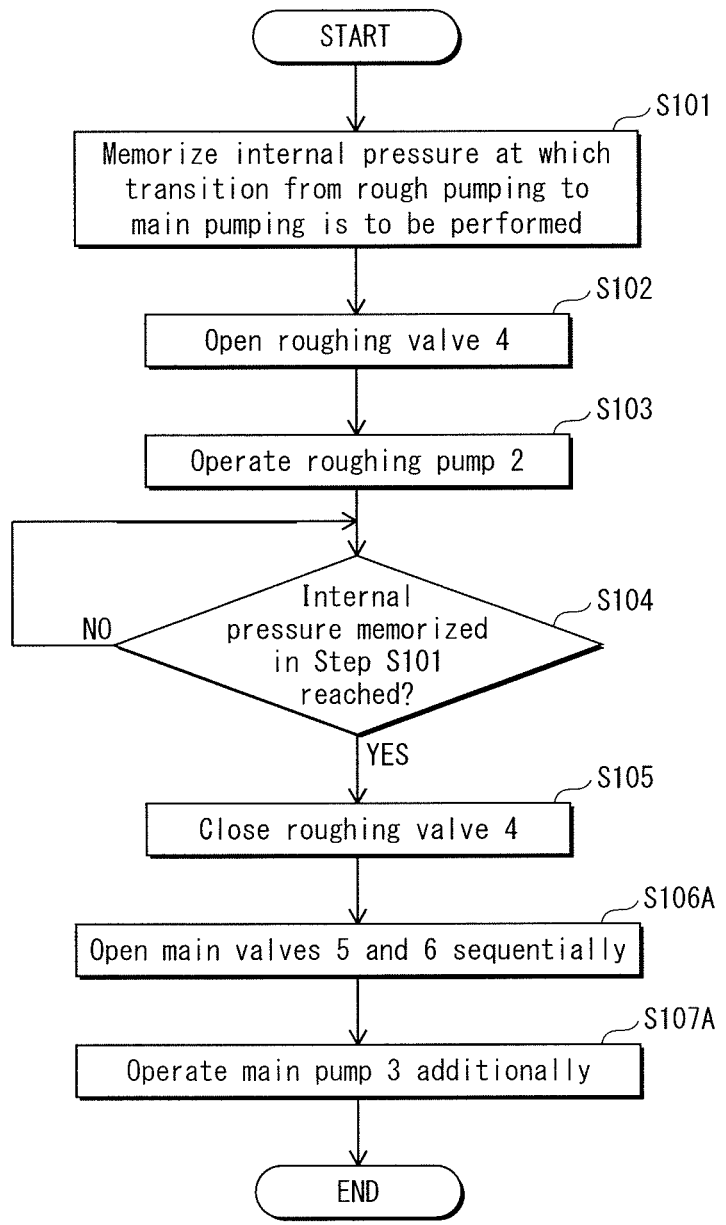
FIG. 22 is a flowchart illustrating operations of a controller included in a vacuum apparatus pertaining to a modification.

FIG. 22 is a flowchart illustrating operations of the controller 9 included in the vacuum apparatus pertaining to a modification. The differences from the flowchart pertaining to Embodiment 1 (FIG. 2) lie in Step S106A and Step S107 corresponding to the main pumping. Upon completion of the rough pumping (Step S105), the main valve 5 and the main valve 6 are opened in this order. Then, the main pump 3, in addition to the roughing pump 2, is put into the operating state (Step S107A).

In the main pumping pertaining to Embodiment 1, only the main pump is put into the operating state. On the other hand, according to the present modification, both the roughing pump and the main pump are put into the operating state. In other words, "the main pumping by which the vacuum chamber after the rough pumping is evacuated by a main pump which is a non-mechanical pump" includes main pumping using only the main pump and main pumping using both the roughing pump and the main pump.

The present modification is applicable to the case where the roughing pump 2 needs to be used in the next stage to the evacuation by the main pump 3. Such a configuration also achieves the advantageous effects explained in the embodiments above.

(6) As described in Embodiment 1, the timing of the transition according to the partial pressure of alkane within the vacuum chamber based was determined based on the case of tetracosane. As a consequence, the inventors found it possible to reduce the amount of impurities that fly back to the vacuum chamber by performing the transition from the rough pumping to the main pumping when the partial pressure of tetracosane is no greater than $7.3 \times 10^{-3}$. However, tetracosane is not the only material that the numeric value $7.3 \times 10^{-3}$ is applicable. As described above, it is presumed that tetracosane has average physical properties of the impurities. Therefore, the numeric value is not only applicable to normal alkanes having 20 to 26 carbon atoms, but also generally applicable to alkanes having a similar molecular weight (i.e. having a similar vapor pressure), and other compounds having a substituent derived from alkane.

Also, as described above, the vapor pressure of the impurities changes depending on the type, for example, of the vacuum pump. Even when the sort of the impurities is different from the above-described impurities, if the temperature of the vacuum pump during its operation and the vapor pressure of the impurities at the temperature are known, it is possible to determine the timing of the transition according to the partial pressure of the impurities. Therefore, the determination of the timing of the transition according to the partial pressure of the impurities is not only applicable to the above-described compounds, but also broadly applicable to general impurities.

(7) In the above-described embodiments, it is stated that even when the surface of the organic light-emitting layer is left with impurities adhering thereto, the impurities have only a small influence on the organic light-emitting layer insofar as not being supplied with electric power. Note, however, that this only applies to organic light-emitting layers. In the case of organic films other than organic light-emitting layers, there is a possibility that the impurities adhering to the organic films degrade the organic films even when no electric power has been applied. In the case of such an organic film, it is difficult to remove the impurities before the reaction of the organic film with the impurities. However, the present invention is very useful even in the case of an organic film, because the present invention prevents impurities from adhering to the organic film. Therefore, it can be said that the present invention is more effective when the object enclosed within the vacuum chamber is likely to absorb impurities.

(8) The method for manufacturing an organic EL display panel described in Embodiment 2 is merely an example. For example, a layer described in the above as being formed by the vacuum film-forming method may be formed by the coating film formation method, or, conversely, a layer described in the above as being formed by the coating film formation method may be formed by the vacuum film-forming method.

(9) In Embodiment 2, the organic film is described as being the organic light-emitting layer. However, the present invention is not limited to this. Among the layers constituting the organic EL elements, all the layers formed by the coating film formation method correspond to the organic films pertaining to the present invention. It is possible to extend the half-life period of the organic EL elements and improve the light-emitting characteristics of the same by applying the above-described evacuation process to the layers formed by the coating film formation method.

(10) In Embodiment 2, the ITO layer, the hole injection layer, the hole transport layer, the banks, and the passivation layer are not essential components. The present invention is applicable to organic EL elements without these components. Conversely, the organic EL elements may additionally include other components such as a hole blocking layer, for example. Accordingly, the substrate prepared in the preparation process does not necessarily have the ITO layer, the hole injection layer, the hole transport layer or the banks. Furthermore, in the case of forming an organic EL element without the passivation layer, it is of course possible to omit the process for forming the passivation layer.

(11) In Embodiment 2, the present invention is mainly related to the processes for forming the organic light-emitting layers in the organic EL elements. However, the present invention is not limited to this. For example, the present invention is applicable to a method for manufacturing an element having an organic film formed by the coating film formation method, such as an organic TFT or a solar cell. That is, the present invention is broadly applicable to formation of an organic film containing an organic material on a substrate. The following briefly describes the case of forming an organic film containing an organic material on a substrate.

First, a preparation process is performed to prepare a substrate, by which an organic film material containing the material of the organic film and solvent is applied to the substrate. Subsequently, the substrate coated with the organic film material is placed within a vacuum chamber, and an evacuation process is performed to evacuate the vacuum chamber by using a roughing pump and a main pump connected to the vacuum chamber. This evacuation process includes: rough pumping by which the vacuum chamber is evacuated by a roughing pump which is a mechanical pump capable of reducing the internal pressure of the vacuum chamber to be less than 15 Pa; and main pumping by which the vacuum chamber after the rough pumping is evacuated by a main pump which is a non-mechanical pump. The transition from the rough pumping to the main pumping is performed when the internal pressure of the vacuum chamber is no less than 15 Pa.

(12) In Embodiment 2, "the coating film of the organic light-emitting material" is described as an organic light-emitting layer formed via the drying process. However, as described above, impurities may adhere to the coating film of the organic light-emitting material in the middle of the drying process. That is, the "the coating film of the organic light-emitting layer material" may refer to an organic light-emitting layer completed by completing the drying of the organic light-emitting layer material, or a coating film of an organic light-emitting layer material in the middle of the drying. The same applies to "the coating film of the organic film material".

(13) In Embodiment 2, the drying process for drying the organic light-emitting layer material is described as the evacuation process. However, the present invention is not limited to this. For example, when the semi-finished organic EL element products are stored in a vacuum for a period between the completion of the organic light-emitting layer and the subsequent process, this storage process also corresponds to the evacuation process during which the impurity contamination might occur. That is, "the substrate coated with the organic light-emitting layer material" may refer to a substrate after the completion of the drying of the coating film and the completion of the organic light-emitting layer, as well as a substrate immediately after the application of the organic light-emitting layer material and before the completion of the drying of the application film. The same applies to "the substrate coated with the organic film material". That is, the method disclosed in the present description for reducing the internal pressure of a vacuum chamber is applicable to the evacuation process performed in the storage process.

Note that, during the drying process, the "substrate immediately after the application of the organic light-emitting layer material and before the completion of the drying of the application film" is being placed within the vacuum chamber. Meanwhile, during the storage process, the "substrate after the completion of the drying of the coating film and the completion of the organic light-emitting layer" is being placed within the vacuum chamber.

Furthermore, the evacuation process corresponds not only to the drying process and the storage process, but also to any processes that are performed after the application of the organic light-emitting layer material and before a process for forming a layer on the upper surface of the organic light-emitting layer, and that are performed for putting the substrate after the application of the organic light-emitting layer material into a vacuum.

(14) The drying of the coating film of the organic light-emitting layer material may be completed by the evacuation process only, by baking only, or the combination of the evacuation process and the baking.

(15) In the embodiments described above, impurities derived from the vacuum pump are explained as one example of impurities caused by the evacuation process. However, this is not essential for the present invention. Also, although impurities derived from a lubricant are explained as one example of impurities derived from the vacuum pump, it is not essential for the present invention that the impurities are derived from a lubricant. For example, the backflow of the impurities may be caused by materials used in the vacuum pump other than the lubricant, such as a vacuum seal material. That is, the present invention is broadly applicable to the reduction of the amount of diffusion, and the resulting adhesion, of impurities caused by the evacuation process.

(16) As described above, the dry pump is used when it is necessary to keep the inside of the vacuum chamber clean. However, as seen from the results shown in FIG. 6, it is presumable that the backflow of the impurities to the vacuum chamber would occur even in the case with a mechanical booster pump, which is generally classified as a dry pump. Simply using a dry pump proved to be not enough to keep the inside of the vacuum chamber clean when the object enclosed within the vacuum chamber is an organic film that is likely to absorb impurities. It is therefore very meaningful that the inventors of the present invention succeeded in keeping the inside of the vacuum chamber free from the impurity contamination by applying the present invention to the case of an organic EL element containing an organic light-emitting layer that is likely to absorb impurities.

(17) Generally, unlike mechanical vacuum pumps, non-mechanical vacuum pumps do not need the use of a lubricant. The non-mechanical pump used in the above-described embodiments performs evacuation by vapor condensation using a cooler. Therefore, even when a lubricant is used in such a non-mechanical pump, the components contained in the lubricant is very unlikely to evaporate. This fact also proves that using a non-mechanical pump as the main pump is very advantageous. On the other hand, mechanical pumps generate heat during their operation, and therefore the components of the lubricant are relatively likely to evaporate.

(18) The phrase: "preparing a substrate coated with an organic light-emitting layer material" pertaining to the present invention may refer to the case where the manufacturer who performs the evacuation process purchases a substrate coated with an organic light-emitting layer material from another manufacturer, as well as the case where the manufacturer who performs the evacuation process applies the organic light-emitting layer material onto the substrate by himself/herself to prepare the substrate. The same applies to the phrase: "preparing a substrate coated with an organic film material".

(19) In Embodiment 2, the hole injection layer is formed to cover the entire upper surface of the substrate. However, the present invention is not limited to this configuration. The hole injection layer may be formed only on the ITO layer. Alternatively, the hole injection layer may be formed to cover only the side surfaces and the upper surface of the ITO layer.

(20) When the anodes are formed from a silver (Ag)-based material, it is preferable that the ITO layer is formed on the anodes as described in embodiments above. When the anodes are formed from an aluminum-based material, the anodes may be formed in a single-layer structure without the ITO layer.

(21) The above-described embodiments describe an organic EL display panel in which a plurality of organic EL elements serving as sub-pixels are integrated on a substrate. However, the organic EL display panel does not necessarily have such a structure, and the organic EL element may be used alone. For example, the organic EL element may be used alone in a lighting apparatus.

(22) According to the above-described embodiments, the organic EL display panel is a full-color display panel that emits light of R, G and B colors. However, the organic EL display panel pertaining to the present invention is not limited to this. The organic EL display panel may be a display panel including an array of a plurality of organic EL elements each emitting light of a single color such as R, G, B or white color. Furthermore, the organic EL display panel may be a single color organic EL display panel having organic EL elements corresponding to one of the above-described colors.

(23) In the above-described embodiments, an organic material is used as the material of the banks. However, inorganic material may be used. If this is the case, the bank material layer may be formed by the coating film formation method for example, as with the case of the organic material. Also, in the organic EL display panel described above, a line bank structure is adopted, in which a plurality of linear banks are formed in stripes to partition the organic light-emitting layer into linear portions. However, the organic EL display panel pertaining to the present invention does not necessarily have this structure. For example, a so-called pixel bank structure may be adopted, in which a bank having a lattice shape is formed to surround each sub-pixel.

(24) In the embodiments above, the method applicable to manufacturing of a top-emission type organic EL display panel is described as an example. However, the present invention is not limited to this. For example, the present invention is applicable to a method of manufacturing a so-called bottom-emission type organic EL display panel in which the surface nearer to the substrate 11 (FIG. 13) serves as the display surface. Furthermore, the present invention is applicable to a method of manufacturing a double-sided organic EL display panel that emits light from both the anode side and the cathode side when the anodes and the cathode are made of a transparent conductive material.

(25) The embodiments above describe organic EL elements in which the first electrodes serve as the anodes and the second electrodes serve as the cathodes. However, the organic EL elements pertaining to the present invention do not necessarily have this configuration. In the organic EL elements, the first electrodes may serve as the cathodes and the second electrodes may serve as the anodes.

(26) The materials, numeric values and so on used in the above-described embodiments are merely preferred examples, and the present invention is not limited to the embodiments specified by them. Furthermore, the structure of the present invention may be appropriately modified without departing from the scope of the technical ideas of the present invention. The components shown in each drawing are not drawn to scale. Also, the numerical ranges are intended to include the endpoints.

INDUSTRIAL APPLICABILITY

The present invention is applicable in a preferable manner to manufacturing of organic EL elements used in various sorts of displays such as household displays, displays in public facilities, displays for professional use, television devices, displays of portable electronic devices, and so on. The present invention is also applicable to various sorts of thin-film forming processes and etching processes.

REFERENCE SIGNS LIST

1 Vacuum chamber
2 Roughing pump
3 Main pump
4 Roughing valve
5 Main valve
6 Main valve (Valve for extended main exhaust pipe)
7 Pressure gage
8 Gas inflow valve
9 Controller
10 Organic EL display panel
11, 101 Substrate
12, 102 Anode
13 ITO layer
14, 103 Hole injection layer
15 Bank
15a Aperture
16, 105 Organic light-emitting layer
16a, 105a Organic light-emitting layer material
17, 106 Electron transport layer
18, 107 Cathode
19, 108 Passivation layer
20 Drive controller
21-24 Drive circuit
25 Control circuit
26 Vacuum chamber
27 Exhaust pipe
28 Mechanical pump
29 Exhaust pipe
30 Impurities
31 Semi-finished product of organic EL element
100 Sub-pixel
104 Hole transport layer
109 Interface region between organic light-emitting layer and electron transport layer
200 Organic EL light-emitting apparatus
210 Organic EL element
220 Base
230 Reflector
1000 Organic EL display device
91 Vacuum chamber
92 Roughing pump
93 Main pump
94 Roughing valve
95 Main valve
96 Main valve

The invention claimed is:

1. A method for forming an organic thin-film element, comprising:
preparing a substrate coated with an organic film material containing a material of an organic film and a solvent; and
placing the substrate coated with the organic film material within a vacuum chamber, and evacuating the vacuum chamber by using a roughing pump and a main pump both connected to the vacuum chamber,
the evacuating including:
rough pumping reducing an internal pressure of the vacuum chamber by using the roughing pump, the roughing pump being a mechanical pump that is capable of reducing the internal pressure of the vacuum chamber to be less than 15 Pa; and
main pumping reducing the internal pressure of the vacuum chamber by using the main pump after the rough pumping, the main pump being a non-mechanical pump, wherein
transition from the rough pumping to the main pumping is performed when the internal pressure of the vacuum chamber is no less than 15 Pa.

2. The method of claim 1, wherein
in the rough pumping,
a rate of reduction of the internal pressure of the vacuum chamber is controlled by introducing an inert gas into the vacuum chamber.

3. The method of claim 1, wherein
the roughing pump is a mechanical booster pump.

4. The method of claim 1, wherein
the main pump performs evacuation by vapor condensation using a cooler.

5. The method of claim 4, wherein
the main pump is a cryogenic pump.

6. A method for forming an organic thin-film element, comprising:
preparing a substrate coated with an organic film material containing a material of an organic film and a solvent; and
placing the substrate coated with the organic film material within a vacuum chamber, and evacuating the vacuum chamber by using a roughing pump and a main pump both connected to the vacuum chamber,
the evacuating including:
rough pumping reducing an internal pressure of the vacuum chamber by using the roughing pump, the roughing pump being a mechanical pump that is capable of reducing the internal pressure of the vacuum chamber to be less than 15 Pa and uses a lubricant containing an alkane; and
main pumping reducing the internal pressure of the vacuum chamber by using the main pump after the rough pumping, the main pump being a non-mechanical pump, wherein
transition from the rough pumping to the main pumping is performed when a ratio of a vapor pressure of an alkane to the internal pressure of the vacuum chamber is no greater than $7.3 \times 10^{-3}$, the alkane having flown to the vacuum chamber from the roughing pump.

7. The method of claim 6, wherein
the alkane is tetracosane.

8. A method for forming an organic thin-film element, comprising:

preparing a substrate coated with an organic film material containing a material of an organic film and a solvent; and placing the substrate coated with the organic film material within a vacuum chamber, and evacuating the vacuum chamber by using a roughing pump and a main pump both connected to the vacuum chamber, the evacuating including:

rough pumping reducing the internal pressure of the vacuum chamber by using the roughing pump, the roughing pump being a mechanical pump that is capable of reducing the internal pressure of the vacuum chamber to be less than 15 Pa and uses a lubricant containing an alkane; and main pumping reducing the internal pressure of the vacuum chamber by using a main pump after the rough pumping, the main pump being a non-mechanical pump, wherein transition from the rough pumping to the main pumping is performed when a rate of reduction of the internal pressure of the vacuum chamber by the roughing pump is no less than 10 Pa/s.

9. An apparatus for manufacturing an organic thin-film element, comprising:

a vacuum chamber within which a substrate coated with an organic film material containing a material of an organic film and a solvent is to be placed;

a roughing pump connected to the vacuum chamber, the roughing pump being a mechanical pump that is capable of reducing an internal pressure of the vacuum chamber to be less than 15 Pa;

a main pump connected to the vacuum chamber, the main pump being a non-mechanical pump;

a roughing valve opening or closing a roughing exhaust pipe extending from the vacuum chamber to the roughing pump;

a main valve provided independently of the roughing valve and opening or closing a main exhaust pipe extending from the vacuum chamber to the main pump; and a controller controlling respective operations of the roughing pump, the main pump, the roughing valve and the main valve, wherein the controller performs a rough pumping operation to open the roughing valve, close the main valve, start operating the roughing pump, and stop operating the main pump, and a main pumping operation to close the roughing valve, open the main valve and start operating at least the main pump, and performs transition from the rough pumping operation to the main pumping operation when the internal pressure of the vacuum chamber is no less than 15 Pa.

10. A method for forming an organic film, comprising:

preparing a substrate coated with an organic film material containing a material of an organic film and a solvent; and placing the substrate coated with the organic film material within a vacuum chamber, and evacuating the vacuum chamber by using a roughing pump and a main pump both connected to the vacuum chamber, the evacuating including:

rough pumping reducing an internal pressure of the vacuum chamber by using the roughing pump, the roughing pump being a mechanical pump that is capable of reducing the internal pressure of the vacuum chamber to be less than 15 Pa; and main pumping reducing the internal pressure of the vacuum chamber by using the main pump after the rough pumping, the main pump being a non-mechanical pump, wherein transition from the rough pumping to the main pumping is performed when the internal pressure of the vacuum chamber is no less than 15 Pa.

11. A method for manufacturing an organic EL element, comprising:

preparing a substrate having: a first electrode formed on an upper surface thereof; and a region located above the first electrode and coated with an organic light-emitting layer material containing a material of an organic light-emitting layer and a solvent;

placing the substrate with the region coated with the organic light-emitting layer material within a vacuum chamber, and evacuating the vacuum chamber by using a roughing pump and a main pump both connected to the vacuum chamber; and forming a second electrode above a coating film of the organic light-emitting layer material, the evacuating including:

rough pumping reducing an internal pressure of the vacuum chamber by using the roughing pump, the roughing pump being a mechanical pump that is capable of reducing the internal pressure of the vacuum chamber to be less than 15 Pa; and main pumping reducing the internal pressure of the vacuum chamber by using the main pump after the rough pumping, the main pump being a non-mechanical pump, wherein transition from the rough pumping to the main pumping is performed when the internal pressure of the vacuum chamber is no less than 15 Pa.

12. A method for manufacturing an organic EL element, comprising:

preparing a substrate having: a first electrode formed on an upper surface thereof; and a region located above the first electrode and coated with an organic light-emitting layer material containing a material of an organic light-emitting layer and a solvent;

placing the substrate having the region coated with the organic light-emitting layer material within a vacuum chamber, and evacuating the vacuum chamber by using a roughing pump and a main pump both connected to the vacuum chamber; and forming a second electrode above a coating film of the organic light-emitting layer material, the evacuating including:

rough pumping reducing an internal pressure of the vacuum chamber by using the roughing pump, the roughing pump being a mechanical pump that is capable of reducing the internal pressure of the vacuum chamber to be less than 15 Pa and uses a lubricant containing an alkane; and main pumping reducing the internal pressure of the vacuum chamber by using the main pump after the rough pumping, the main pump being a non-mechanical pump, wherein transition from the rough pumping to the main pumping is performed when a ratio of a vapor pressure of an alkane to the internal pressure of the vacuum chamber is no greater than $7.3 \times 10^{-3}$, the alkane having flown to the vacuum chamber from the roughing pump.

* * * * *